United States Patent
Aoki et al.

(10) Patent No.: US 7,433,637 B2
(45) Date of Patent: Oct. 7, 2008

(54) IMAGE FORMING APPARATUS AND METHOD OF MANUFACTURING ELECTRONIC CIRCUIT USING THE SAME

(75) Inventors: Hideo Aoki, Yokohama (JP); Naoko Yamaguchi, Yokohama (JP); Chiaki Takubo, Tokyo (JP); Toshiaki Yamauchi, Fujisawa (JP); Koji Imamiya, Kawasaki (JP); Hiroshi Hashizume, Hino (JP)

(73) Assignees: Kabsushiki Kaisha Toshiba, Tokyo (JP); Toshiba TEC Corporation, Tokyo (JP)

( * ) Notice: Subject to any disclaimer, the term of this patent is extended or adjusted under 35 U.S.C. 154(b) by 481 days.

(21) Appl. No.: 11/100,388

(22) Filed: Apr. 7, 2005

(65) Prior Publication Data

US 2005/0227161 A1    Oct. 13, 2005

(30) Foreign Application Priority Data

| Apr. 8, 2004 | (JP) | ............................ P2004-114059 |
| Apr. 9, 2004 | (JP) | ............................ P2004-115795 |
| Jun. 1, 2004 | (JP) | ............................ P2004-163408 |

(51) Int. Cl.
    *G03G 15/16* (2006.01)
    *G03G 15/14* (2006.01)

(52) U.S. Cl. ...................................... 399/297; 399/315

(58) Field of Classification Search ................ 399/252, 399/299, 301, 315, 394, 297
See application file for complete search history.

(56) References Cited

U.S. PATENT DOCUMENTS

| 4,696,861 A | 9/1987 | Tatematsu et al. |
| 4,897,326 A | 1/1990 | Marengo |
| 5,499,093 A * | 3/1996 | Aerens et al. ................ 399/228 |
| 5,758,247 A * | 5/1998 | Yanashima et al. .......... 399/384 |
| 6,214,508 B1 | 4/2001 | Kamada et al. |
| 6,440,625 B1 | 8/2002 | Berlin |

(Continued)

FOREIGN PATENT DOCUMENTS

JP      07-263841      10/1995

(Continued)

OTHER PUBLICATIONS

Yamaguchi, et al., "New Process of Manufacturing Printed Circuit Boards Using Electrophotography Technology", 2004 ICEP Proceedings, pp. 168-172, (Apr. 2004).

(Continued)

*Primary Examiner*—Hoang Ngo
(74) *Attorney, Agent, or Firm*—Finnegan, Henderson, Farabow, Garrett & Dunner, L.L.P.

(57) ABSTRACT

An image forming apparatus comprises an exposure unit forming an electrostatic latent image on a photoconductor based on image information, a developing unit developing the electrostatic latent image by toner made of formation material of a circuitry layer, and an electrostatic transferring unit transferring a toner image on the photoconductor onto a substrate. The toner image is transferred so as to cover at least a part of a conductor layer formed on the substrate. At this time, excessive charges caused in the conductor layer accompanying the start of the transfer of the toner image are removed. Alternatively, charges of which polarity is reverse to that of the toner are added to the conductor layer. These allow the circuitry layer to be formed to have a desired pattern favorably and securely on the conductor layer.

12 Claims, 16 Drawing Sheets

U.S. PATENT DOCUMENTS

| | | | |
|---|---|---|---|
| 6,524,758 B2 * | 2/2003 | Eberlein et al. | 430/11 |
| 2004/0197487 A1 | 10/2004 | Aoki et al. | |
| 2005/0053772 A1 | 3/2005 | Aoki et al. | |

FOREIGN PATENT DOCUMENTS

| | | |
|---|---|---|
| JP | 08-056077 | 2/1996 |
| JP | 2001-284769 | 10/2001 |
| JP | 2004-048030 | 2/2004 |

OTHER PUBLICATIONS

Aoki, et al.; "Method of Manufacturing an Electronic Circuit and Manufacturing Apparatus of an Electronic Circuit"; U.S. Appl. No. 10/618,631, filed Jul. 15, 2003.

* cited by examiner

IMAGE FORMING APPARATUS AND METHOD OF MANUFACTURING ELECTRONIC CIRCUIT USING THE SAME

CROSS-REFERENCE TO THE INVENTION

This application is based upon and claims the benefit of priority from the prior Japanese Patent Application No. 2004-114059 filed on Apr. 8, 2004, Japanese Patent Application No. 2004-115795 filed on Apr. 9, 2004, and Japanese Patent Application No. 2004-163408 filed on Jun. 1, 2004; the entire contents of which are incorporated herein by reference.

BACKGROUND OF THE INVENTION

1. Field of the Invention

The present invention relates to an image forming apparatus to which an electrophotographic system is applied, and a method of manufacturing an electronic circuit using the same.

2. Description of the Related Art

Conventionally, etching and screen printing methods have been heavily used in forming an electronic circuit applied to a wiring board, semiconductor element and the like. When the etching method is used to form a conductor pattern, exposure masks are necessary for respective layers. In the screen printing method, exclusive masks are necessary as well. Since tremendous amounts of money and time are required in designing and manufacturing these masks, manufacturing cost and manufacturing time of the electronic circuit are affected significantly. In order to solve such problems of the conventional methods, the method of forming the conductor pattern and the like by using an electrophotographic system has been developed (refer to Japanese Patent Laid-open Application No. Hei 7-263841, Japanese Patent Laid-open Application No. 2001-284769, for example).

The conductor pattern to which the electrophotographic system is applied is formed as follows, for example. First, toner (charged particles) which contains metal fine particles in insulating resin particles made of thermosetting resin such as epoxy resin is used to selectively form a plating base layer on a substrate. This plating base layer is subjected to electroless plating, whereby a metal conductor layer having a desired circuit pattern is formed (refer to Japanese Patent Application Laid-open No. 2004-048030, for example). The electrophotographic system is also applied to the formation of an insulating layer. The insulating layer is formed by bringing the toner made of the insulating resin particles into adhesion onto the substrate, and thermally fixing this insulating resin particle layer.

An image forming apparatus used in manufacturing the electronic circuit is mainly constituted of an exposure unit forming an electrostatic latent image on a photoconductive drum, a developing unit bringing the toner into adhesion with the electrostatic latent image to form a visible image, a transferring unit transferring the visible image by the toner (toner image) onto the substrate, and a fixing unit fixing the toner image transferred onto the substrate. Although several methods, such as an electrostatic transfer method, pressure transfer method, adhesive transfer method and the like, are known as the method of transferring the toner image formed on the surface of the photoconductive drum onto the substrate, the electrostatic transfer method which is suitable for high speed and whose structure is relatively simple is heavily used in general copying machines, laser printers and the like.

The electrostatic transfer method is the method of transferring the toner image formed on the surface of a photoconductor onto the substrate by electrostatic force. When negative-charged toner is transferred from the surface of the photoconductor onto the substrate, for example, a voltage is applied between the photoconductor and the substrate so that positive charges whose polarity is reverse to that of the toner are added to the back face side of the substrate. By generating an electric field between the photoconductor and the substrate based on the application of the voltage, the negative-charged toner is moved from the surface of the photoconductor onto the substrate by the electrostatic force. Thus, the toner image formed on the surface of the photoconductor is electrostatically transferred onto the substrate.

When the electronic circuit is manufactured using the electrophotographic system, it is essential that the insulating layer is formed on the metal conductor layer using the insulating resin particles as the toner. When the electrostatic transfer method is applied to formation process of the insulating layer using the insulating resin particles, the problem is caused that the transfer of the insulating resin particles (toner) onto the metal conductor layer is performed less sufficiently toward the rear side in the moving direction of the substrate. Namely, although the insulating resin particles are transferred comparatively well on the front side in the moving direction of the metal conductor layer, the insulating resin particles cease to be transferred from the middle of the metal conductor layer and only the defective insulating layer is obtainable. This is supposed to be caused by an electrostatic induction phenomenon of the conductor by the electric field.

Further, when the electrophotographic system is applied to the formation of the insulating layer, it is necessary to form the insulating layer to have a desired pattern with high accuracy on the conductor layer having various circuit patterns. However, since the conventional image forming apparatus has low accuracy of positioning of respective patterns, it has the problem that accuracy of form and the like of the electronic circuit tend to lower. The electrophotographic system is also applied to the manufacturing of a wiring board having multilayer wiring structure. The wiring board having the multilayer wiring structure is manufactured by layering the conductor layers and insulating layers for plural times. In such a case, the positioning of the respective patterns becomes further difficult.

In formation process of the conductor layer to which the electrophotographic system is applied, the plating base layer is formed using the toner containing the metal particles in the insulating resin particles, as described above. The toner containing the metal particles has low electrical resistance, and is difficult to control the amount of charges as compared to normal toner for electrophotography. Additionally, the thermosetting resin such as epoxy resin which constitutes the metal particle-containing toner has more functional groups as compared to thermoplastic resin such as styrene resin and polyester resin which are used for the normal toner for electrophotography. It is therefore difficult to maintain the amount of charges especially in a high-humidity environment because of moisture absorption.

Under the condition where the electrical resistance of the toner is low and the amount of charges is decreased, the phenomenon in which the toner adheres to the parts without the electrostatic latent image on the photoconductor, that is, the so-called "fog" tends to be caused. When the "fog" is caused, the toner adheres to the parts other than the developed circuit pattern, whereby the problems such as a short circuit are caused in the circuit by the conductor layer. This results in lower reliability and a lower manufacturing yield of the electronic circuit which is applied to the wiring board and the like.

As described thus far, the manufacturing process of the electronic circuit using the conventional image forming apparatus has the problem that defective shapes of the respective layers constituting the electronic circuit, such as transfer failure of the insulating layer and the like, positioning failure of the respective layers, the fog in forming the conductor layer (plating base layer) and the like, tend to be caused. The transfer failure due to the electrostatic induction phenomenon of the conductor is not limited to the insulating layer. The transfer failure may be caused similarly when the electrophotographic system is applied to the formation of a semiconductor layer, for example, depending on the magnitude of the electric field to be applied. Accordingly, the technique of forming the respective layers constituting the electronic circuit to have desired patterns favorably and securely is required.

SUMMARY OF THE INVENTION

It is an object of the present invention to provide an image forming apparatus and a method of manufacturing an electronic circuit which make it possible to prevent defective shapes of respective layers constituting the electronic circuit. Moreover, it is an object of the present invention to provide the image forming apparatus and the method of manufacturing the electric circuit which can form a circuitry layer having a desired pattern favorably and securely, in forming the circuitry layer such as an insulating layer, semiconductor layer and the like on a conductor layer using an electrophotographic system. It is another object of the present invention to provide the image forming apparatus and the method of manufacturing the electric circuit which prevent the phenomenon in which toner adheres to parts without an electrostatic latent image (fog) to form a clear conductor pattern with high reproducibility, in forming the conductor pattern on a substrate using the electrophotographic system. It is still another object of the present invention to provide the image forming apparatus and the method of manufacturing the electric circuit which can enhance accuracy of position of the circuitry layer, in forming the circuitry layer on the substrate using the electrophotographic system.

According to a mode of the present invention, an image forming apparatus forming an image on a substrate having a conductor layer, using toner containing formation material of a circuitry layer, comprises a photoconductor, an exposure unit exposing the photoconductor based on image information of the circuitry layer to form an electrostatic latent image on the photoconductor, a developing unit developing the electrostatic latent image on the photoconductor by the toner to form a toner image on the photoconductor, an electrostatic transferring unit transferring the toner image on the photoconductor onto the substrate so that at least a part of the conductor layer is covered with the toner image, and a charge removing unit arranged to be in electrical contact with at least a part of an exposed face of the conductor layer to remove excessive charges caused in the conductor layer accompanying the start of the transfer of the toner image.

According to another mode of the present invention, an image forming apparatus forming an image on a substrate having a conductor layer, using toner containing formation material of a circuitry layer, comprises a photoconductor, an exposure unit exposing the photoconductor based on image information of the circuitry layer to form an electrostatic latent image on the photoconductor, a developing unit developing the electrostatic latent image on the photoconductor by the toner to form a toner image on the photoconductor, an electrostatic transferring unit transferring the toner image on the photoconductor onto the substrate so that at least a part of the conductor layer is covered with the toner image, and a bias voltage applying unit arranged to be in electrical contact with at least a part of an exposed face of the conductor layer to add charges of which polarity is reverse to that of the toner to the conductor layer.

According to still another mode of the present invention, an image forming apparatus forming an image on a substrate using toner containing metal particles, comprises a photoconductor, a charging unit charging the photoconductor, an exposure unit exposing the photoconductor which is charged in the charging unit, based on image information, a developing unit developing the photoconductor which is exposed in the exposure unit, using the toner, a controlling unit controlling an absolute value of white contrast of the photoconductor to 200 V or lower, when developing the photoconductor in the developing unit, and a transferring unit transferring a toner image, which is formed on the photoconductor in the developing unit, onto the substrate.

According to yet another mode of the present invention, an image forming apparatus forming an image on a substrate, comprises a photoconductor, an exposure unit exposing the photoconductor based on image information to form an electrostatic latent image on the photoconductor, a developing unit developing the electrostatic latent image on the photoconductor by toner to form a toner image on the photoconductor, a transferring unit transferring the toner image on the photoconductor onto the substrate, a substrate carrier unit comprising a positioning means to mount the substrate on a predetermined position and a reference marker to show the position of the substrate to be carried, to carry the substrate so that the substrate moves between the photoconductor and the transferring unit, a detecting unit detecting the passage of the reference marker, and a controlling unit allowing the exposure unit to start exposure of the photoconductor, by taking time when the detecting unit detects the passage of the reference marker as a reference.

According to still another mode of the present invention, an image forming apparatus forming an image on a substrate, comprises a first image forming unit comprising a first photoconductor, a first exposure unit exposing the first photoconductor based on image information to form an electrostatic latent image on the first photoconductor, a first developing unit developing the electrostatic latent image on the first photoconductor by metal particle-containing toner to form a toner image on the first photoconductor, and a first transferring unit transferring the toner image on the first photoconductor onto the substrate, a second image forming unit comprising a second photoconductor, a second exposure unit exposing the second photoconductor based on image information to form an electrostatic latent image on the second photoconductor, a second developing unit developing the electrostatic latent image on the second photoconductor by toner for forming an insulating layer to form a toner image on the second photoconductor, and a second transferring unit transferring the toner image on the second photoconductor onto the substrate, a substrate carrier unit comprising a positioning means to mount the substrate on a predetermined position and a reference marker to show the position of the substrate to be carried, to carry the substrate so that the substrate moves between the first photoconductor and the first transferring unit and between the second photoconductor and the second transferring unit, a detecting unit detecting the passage of the reference marker, and a controlling unit controlling the formation of the image by the first and second image forming units, by taking time when the detecting unit detects the passage of the reference marker as a reference.

According to a mode of the present invention, a method of manufacturing an electronic circuit having a circuitry layer formed on a substrate having a conductor layer, comprises exposing a photoconductor based on image information of the circuitry layer to form an electrostatic latent image on the photoconductor, developing the electrostatic latent image on the photoconductor by toner containing formation material of the circuitry layer to form a toner image on the photoconductor, electrostatically transferring the toner image on the photoconductor onto the substrate so that at least a part of the conductor layer is covered, while removing excessive charges caused in the conductor layer accompanying the start of the transfer of the toner image, and fixing the toner image transferred onto the substrate.

According to another mode of the present invention, a method of manufacturing an electronic circuit having a circuitry layer formed on a substrate having a conductor layer, comprises exposing a photoconductor based on image information of the circuitry layer to form an electrostatic latent image on the photoconductor, developing the electrostatic latent image on the photoconductor by toner containing formation material of the circuitry layer to form a toner image on the photoconductor, electrostatically transferring the toner image on the photoconductor onto the substrate so that at least apart of the conductor layer is covered, while adding charges of which polarity is reverse to that of the toner to the conductor layer, and fixing the toner image transferred onto the substrate.

According to still another mode of the present invention, a method of manufacturing an electronic circuit having a circuitry layer formed on a substrate having a conductor layer, comprises exposing a photoconductor based on image information of the circuitry layer to form an electrostatic latent image on the photoconductor, developing the electrostatic latent image on the photoconductor by toner containing formation material of the circuitry layer to form a toner image on the photoconductor, electrostatically transferring the toner image on the photoconductor onto the substrate having a conductor buffer layer connected to the conductor layer so that at least a part of the conductor layer is covered, and fixing the toner image transferred onto the substrate.

According to yet another mode of the present invention, a method of manufacturing an electronic circuit on a substrate using metal particle-containing toner, comprises charging a photoconductor, exposing the photoconductor which is charged based on image information to form an electrostatic latent image on the photoconductor, developing the electrostatic latent image on the photoconductor by the toner to form a toner image on the photoconductor, while controlling an absolute value of white contrast of the photoconductor to 200 V or lower, transferring the toner image on the photoconductor onto the substrate, fixing the toner image transferred onto the substrate, and subjecting the fixed toner image to electroless plating using the metal particles exposing on a surface of the toner image as nuclei.

According to still another mode of the present invention, a method of manufacturing an electronic circuit on a substrate, comprises carrying the substrate, which is mounted on a predetermined position of a carrier unit using a positioning member, by the carrier unit, detecting the passage of a reference marker which is provided to the carrier unit and moves with the substrate, starting exposure a photoconductor based on image information to form an electrostatic latent image on the photoconductor, by taking time when the passage of the reference marker is detected as a reference, developing the electrostatic latent image on the photoconductor by toner to form a toner image on the photoconductor, transferring the toner image on the photoconductor onto the substrate carried by the carrier unit, and fixing the toner image transferred onto the substrate.

BRIEF DESCRIPTION OF THE DRAWINGS

Although the present invention will be described with reference to the drawings, these drawings are presented only for illustrative purposes only and are by no means intended to limit the invention.

DETAILED DESCRIPTION

Hereinafter, embodiments of the present invention will be explained with reference to the drawings. Although the embodiments of the present invention will be described based on the drawings, these drawings are presented only for illustrative purposes only and are by no means intended to limit the invention.

Figure 1:
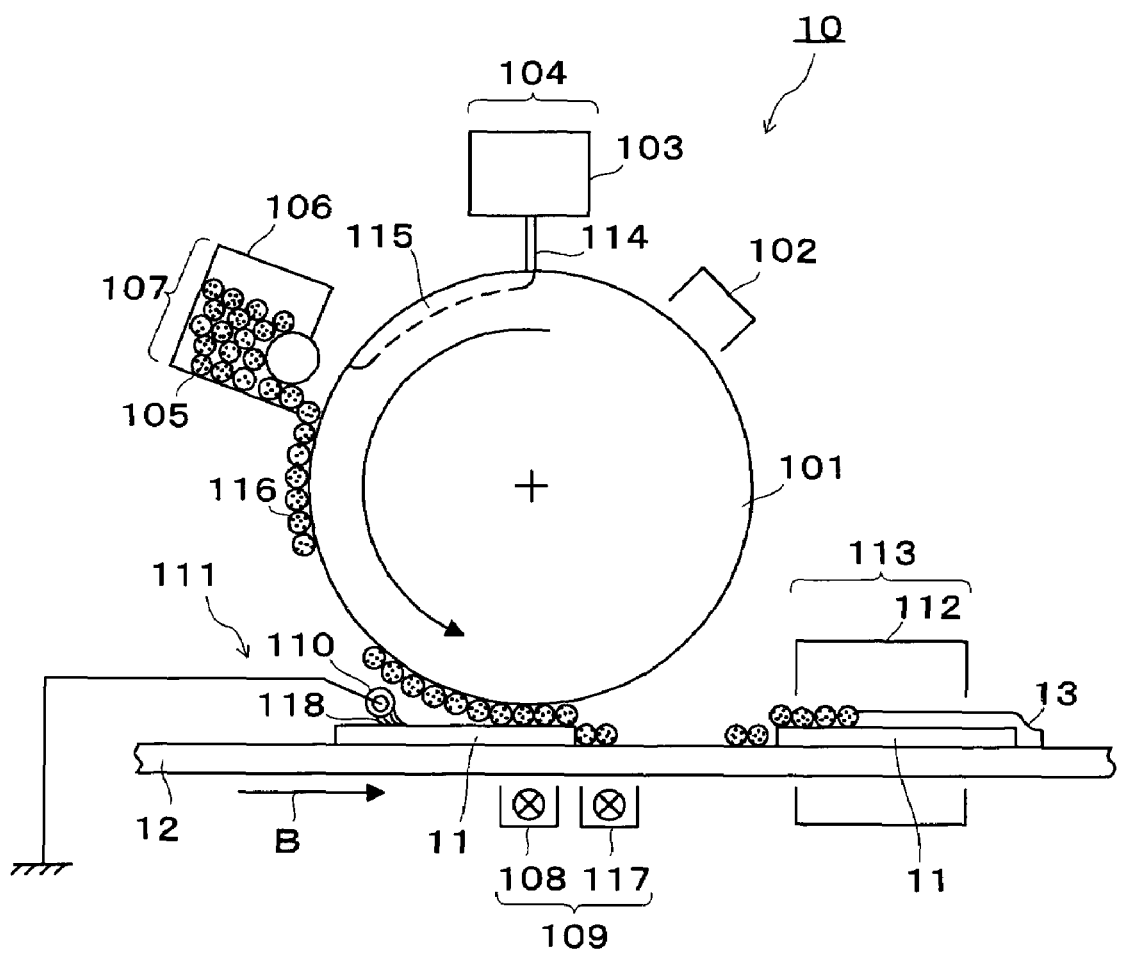
FIG. 1 is a front view showing the schematic structure of an image forming apparatus according to a first embodiment of the present invention.
Figure 2:
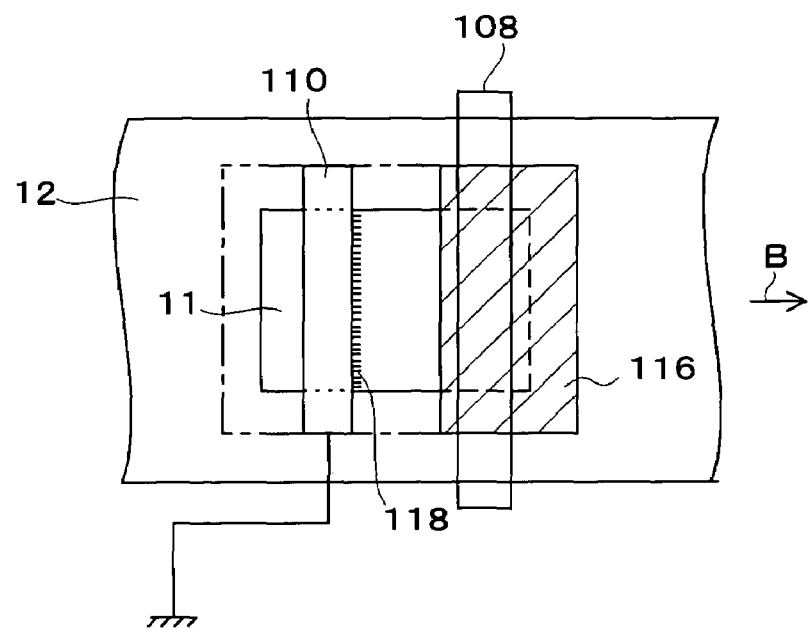
FIG. 2 is a plan view showing the essential structure of the image forming apparatus shown in FIG. 1.

FIG. 1 and FIG. 2 are views showing the structure of an image forming apparatus according to a first embodiment of the present invention. FIG. 1 is a front view schematically showing the structure of the image forming apparatus, and FIG. 2 is a plan view showing the essential structure of the image forming apparatus. An image forming apparatus 10 shown in these drawings, to which an electrophotographic system is applied, is used as a manufacturing apparatus of an electronic circuit, for example. The manufacturing apparatus of the electronic circuit is used for manufacturing an electronic circuit which has, for example, an insulating layer or a semiconductor layer as a circuitry layer 13 formed on a substrate 12 having a conductor layer 11.

The image forming apparatus 10 is mainly constituted of a photoconductive drum 101 having a photoconductive function, an electrifier 102, an exposure unit 104 having a laser generation/scan device 103, a developing unit 107 which has a developing machine 106 accommodating toner 105 made of forming material of the circuitry layer 13, an electrostatic transferring unit 109 having a charge supplying mechanism 108 for electrostatic transfer, a charge removing unit 111 having an excessive charge removing mechanism 110 for reducing a potential difference in the conductor layer 11 when electrostatically transferring the toner 105, and a fixing unit 113 having a fixing device 112.

The photoconductive drum 101 is rotatable in the direction of an arrow A in the drawing so as to pass through the electrifier 102, exposure unit 104, developing unit 107 and electrostatic transferring unit 109 in order. The electrifier 102 charges the photoconductive drum 101 so that the surface thereof has a certain potential (negative charges, for example). Charging methods include, for example, a scorotron charging method, roller charging method, brush charging method, and the like. The exposure unit 104 irradiates the surface of the photoconductive drum 101, on which the negative charges are generated, for example, with a laser beam 114 according to image information (formation pattern) of the circuitry layer 13, and removes the negative charges on a portion irradiated with the laser beam 114 by a photoelectric effect of a photoconductor, to form an electrostatic latent image (image of charges) 115.

The developing unit 107 supplies the toner (toner) 105 from the developing machine 106 and brings the toner 105 into adhesion with the electrostatic latent image 115 to form a visible image (toner image) 116. The toner image 116 has the shape corresponding to the formation pattern of the circuitry layer 13. The electrostatic transferring unit 109 has the charge supplying mechanism 108 supplying charges whose polarity (positive charges, for example) is reverse to that of the toner 105 on the opposite face (back face) side to the formation face of the conductor layer 11 of the substrate 12.

In the electrostatic transferring unit 109, the substrate 12 is moved in the same direction (the direction of an arrow B) as the photoconductive drum 101. Electrostatic force between the positive charges added to the back face side of the substrate 12 and the negative charges of the toner 105 causes the toner image 116 to be transferred onto the substrate 12. In the drawing, 117 denotes a mechanism subjecting the substrate 12 to charge removing processing, after the toner image 116 is transferred thereto.

Figure 3:
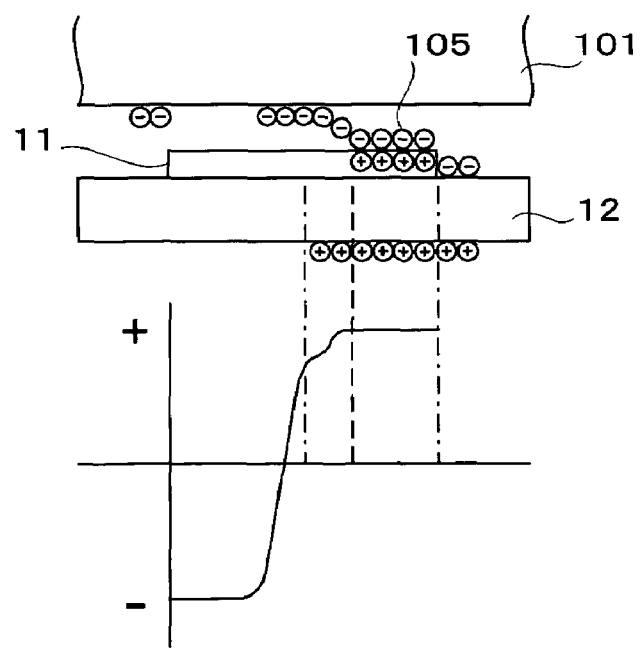
FIG. 3 is a view for explaining the state of potential in a conductor layer according to the conventional method.

When the transfer of the toner image 116 is started in the electrostatic transferring unit 109, excessive charges are generated near the surface of the conductor layer 11, and a potential difference is caused based on the excessive charges. This potential difference in the conductor layer 11 causes transfer failure of the toner image 116. Namely, when a part of the conductor layer 11 is disposed inside an electric field as shown in FIG. 3, the potential difference is caused between the portion of the conductor layer 11 in the electric field and the portion out of the electric field. Based on the potential difference caused in the conductor layer 11, the toner 105 near the conductor layer 11 is rejected. Thus, the transfer of the toner image 116 may become defective.

Therefore, the image forming apparatus 10 of this embodiment has the charge removing unit 111 which removes the excessive charges in the conductor layer 11 so as to reduce the potential difference caused in the conductor layer 11 accompanying the start of the transfer of the toner image 116. The charge removing unit 111 has the excessive charge removing mechanism 110 which is so arranged that it is in electrical contact with a part or an entire face of an exposed face (face where the toner image 116 is not yet transferred) of the conductor layer 11 to which the toner image 116 is started to be transferred. In other words, the charge removing unit 111 has the excessive charge removing mechanism 110 which is in electrical contact with the exposed face of the conductor layer 11 arranged on the rear side in the moving direction of the substrate 12, to which the addition of the positive charges is started in the electrostatic transferring unit 109.

The excessive charge removing mechanism 110 has a contact portion 118 made of, for example, conductive material. The conductive contact portion 118 is grounded. The conductive contact portion 118 is constituted of a brush made of, for example, the conductive material so that it can obtain an excellent contact state with the surface of the conductor layer 11 which moves in the direction of the arrow B in the drawing. Instead of the conductive brush, the conductive contact portion 118 may be constituted of a conductive roller, band-shaped or plate-shaped conductive rubber, and so on. It is preferable that the conductive contact portion 118 has the shape and material which do not cause damage to the surface of the conductor layer 11. Further, it is preferable that the conductive contact portion 118 has the shape that it is in contact with the entire surface of the conductor layer 11.

The toner image 116 which is transferred onto the substrate 12 in the electrostatic transferring unit 109 is subjected to heating processing according to thermal properties of the toner 105 or ultraviolet irradiating processing in the fixing device 112. By performing such fixing processing, the circuitry layer 13 is formed on the substrate 12. The circuitry layer 13 is formed so as to cover at least a part of the conductor layer 11. After the toner image 116 is transferred, the residual toner 105 on the surface of the photoconductive drum 101 is removed and recovered by a not-shown cleaning device.

Figure 4:
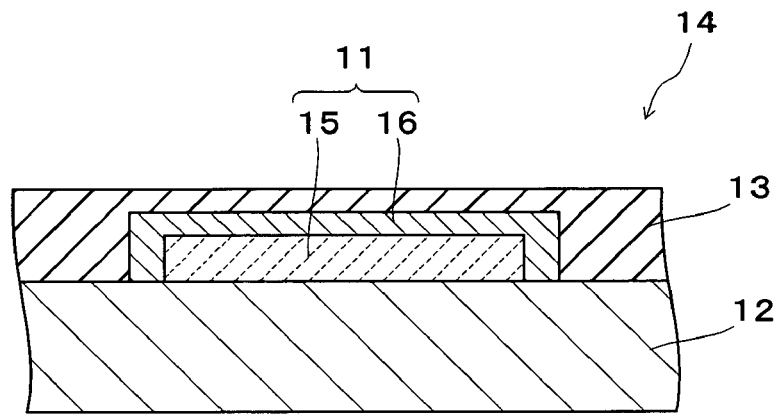
FIG. 4 is a sectional view showing a structural example of a wiring board manufactured by using the image forming apparatus shown in FIG. 1.

Next, formation process of the circuitry layer 13 using the above-described image forming apparatus 10 will be explained. Here, the formation process of the circuitry layer will be described by taking the case where an insulating layer is formed as the circuitry layer 13 on the substrate 12 having the conductor layer 11 as an example. FIG. 4 is a sectional view schematically showing a structural example of a wiring board to which the formation process of the insulating layer 13 of this embodiment is applied. A wiring board 14 shown in FIG. 4 has a circuit pattern of a single layer structure. Incidentally, the wiring board to which the formation process of the insulating layer 13 is applied may have a multilayer structure. Moreover, it can be applied to the formation process of the insulating layer 13 of an electronic device, electronic component and the like, besides the wiring board.

The wiring board 14 shown in FIG. 4 has a substrate 12 on which a metal conductor layer 11 is formed. The metal conductor layer 11 has a plating base layer 15 selectively formed on the substrate 12, and a metal plating layer 16 formed on the surface of the plating base layer 15. The plating base layer 15 is formed by the electrophotographic system using, for example, insulating resin particles containing metal fine particles as the toner. By immersing the substrate 12 having the plating base layer 15 in an electroless plating tank such as Cu, the metal such as Cu precipitates selectively by using the metal fine particles projecting from the surface of the plating base layer 15 as nuclei, whereby the metal plating layer 16 is formed.

At least a part of the surface of the metal conductor layer 11 and the substrate 12 is covered with the insulating layer 13. The insulating layer 13 is formed to have a desired pattern using the electrophotographic system. Although its formation pattern is not particularly limited, the insulating layer 13 is formed so as to cover at least a part of the metal conductor layer 11. Thermosetting resin which is generally used as forming material of the insulating layer of the wiring board is employed as the material constituting the insulating layer 13. The thermosetting resin includes epoxy resin, phenol resin, silicone resin, polyimide resin, bismaleimide resin, cyanate ester resin, bismaleimide-triazine resin, benzocyclobutene resin, polybenzoxazole resin, butadiene resin, polycarbodiimide resin, polyurethane resin, and the like.

The insulating layer 13 is formed using the image forming apparatus 10 as follows. First, the insulating resin particles (thermosetting resin particles, for example) are filled in the developing machine 16 as the toner 105, and the substrate 12 having the metal conductor layer 11 is set in the image forming apparatus 10. While the photoconductive drum 101 is rotated in the direction of the arrow, the substrate 12 is moved in the same direction as the rotating direction of the photoconductive drum 101. The photoconductive drum 101 is made to pass through the electrifier 102 and the exposure unit 104 in order, whereby the electrostatic latent image 115 is formed on its surface corresponding to the formation pattern of the insulating layer 13. Subsequently, the developing machine 106 supplies the insulating resin particles as the toner 105 and brings the toner 105 into adhesion with the electrostatic latent image 115 to form the toner image (insulating resin particle image) 116.

Figure 5:
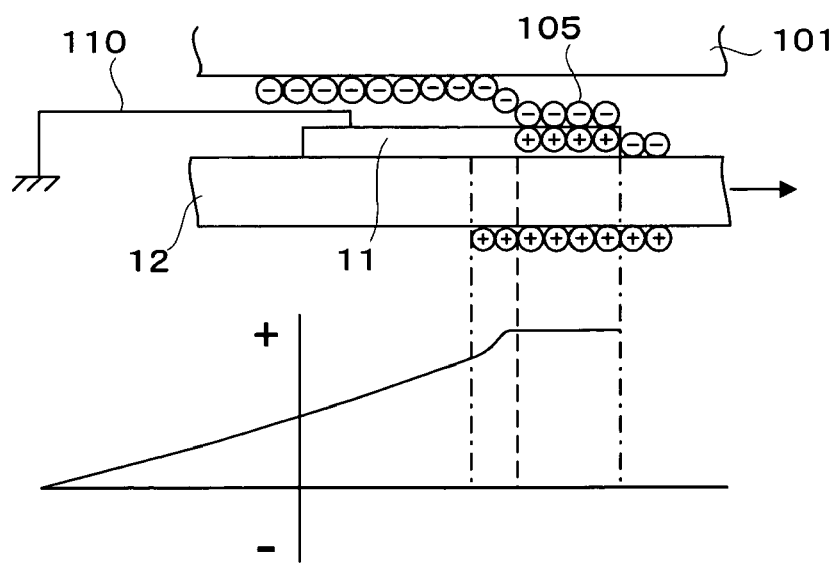
FIG. 5 is a view for explaining the state of potential in the conductor layer when forming an insulating layer by using the image forming apparatus shown in FIG. 1.

Next, the toner image 116 is electrostatically transferred onto the substrate 12 in the electrostatic transferring unit 109. When the electrostatic transfer of the toner image 116 is started, the excessive charges are generated in the metal conductor layer 11. As to such excessive charges, the excessive charge removing mechanism 110 being grounded is in contact with the exposed face of the metal conductor layer 11 where the toner image 116 is not yet transferred. Therefore, the excessive charges caused in the metal conductor layer 11 are removed as shown in FIG. 5, and the potential difference can be reduced. Accordingly, it is possible to prevent the phenomenon that the toner (insulating resin particles) 105 on the photoconductive drum 101 is rejected due to the potential difference in the metal conductor layer 11.

As described above, the excessive charge removing mechanism 110 is made in contact with the exposed face of the metal conductor layer 11 located on the rear side in the moving direction of the substrate 12, to which the addition of the positive charges is started in the electrostatic transferring unit 109, so that the potential difference in the metal conductor layer 11 is reduced. Thereby, it is possible to transfer the toner image 116 to the entire surface of the metal conductor layer 11 (especially on the rear end side relative to the moving direction of the substrate 12) favorably and securely. By thermally fixing such a toner image 116 in the fixing unit 112, for example, the entire surface of the metal conductor layer 11 can be covered by the sound insulating layer 13. Namely, the insulating layer 13 can be favorably and securely formed to have the desired pattern on the metal conductor layer 11. This contributes significantly to the improvement of a manufacturing yield and manufacturing efficiency of the electronic circuit by the electrophotographic system (wiring board in this embodiment).

Figure 6:
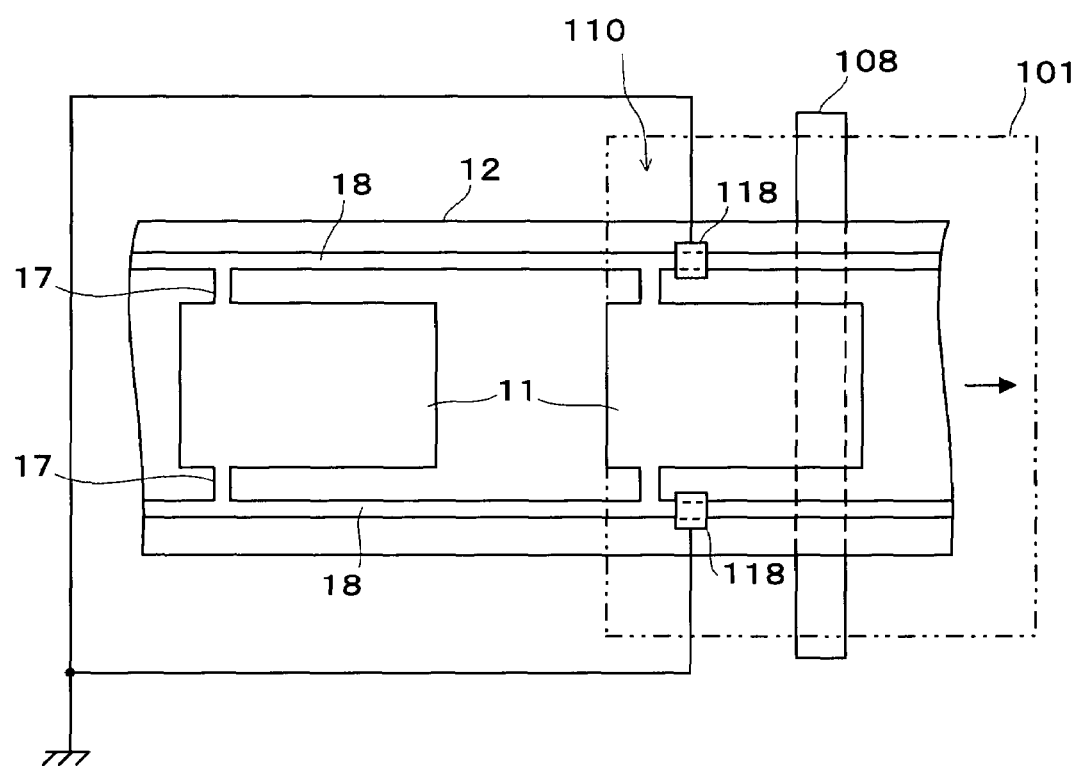
FIG. 6 is a plan view showing the essential structure of a modification example of the image forming apparatus shown in FIG. 1.

Incidentally, the case where the conductive contact portion 118 of the excessive charge removing mechanism 110 is made in contact with the surface of the conductor layer 11 directly is explained according to the image forming apparatus 10 of the above-described embodiment. However, the structure of the excessive charge removing mechanism 110 is not limited to the above. For example, as shown in FIG. 6, dummy patterns 18 which are connected to the conductor layer 11 via leading wires 17 are formed on the substrate 12 in advance. The conductive contact portion 118 of the excessive charge removing mechanism 110 may be made in contact with such dummy patterns 18. The substrate 12 shown in FIG. 6 has the dummy patterns 18 which are respectively formed on both sides of the conductor layer 11 continuously along the moving direction of the substrate 12, and the conductive contact portions 118 are in contact with these dummy patterns 18, respectively.

Even when the excessive charge removing mechanism 110 is thus connected to the conductor layer 11 via the dummy patterns 18, it is possible to remove the excessive charges caused in the metal conductor layer 11 accompanying the start of the electrostatic transfer. Namely, the potential difference in the conductor layer 11 can be reduced, and therefore the insulating layer 13 can be formed to have the desired pattern on the conductor layer 11 favorably and securely. Further, the use of the dummy patterns 18 eliminates the need to contact the conductive contact portion 118 of the excessive charge removing mechanism 110 with the conductor layer 11 directly, so that the occurrence of failure due to loss, peeling and the like of the conductor layer 11 can be prevented.

Figure 7:
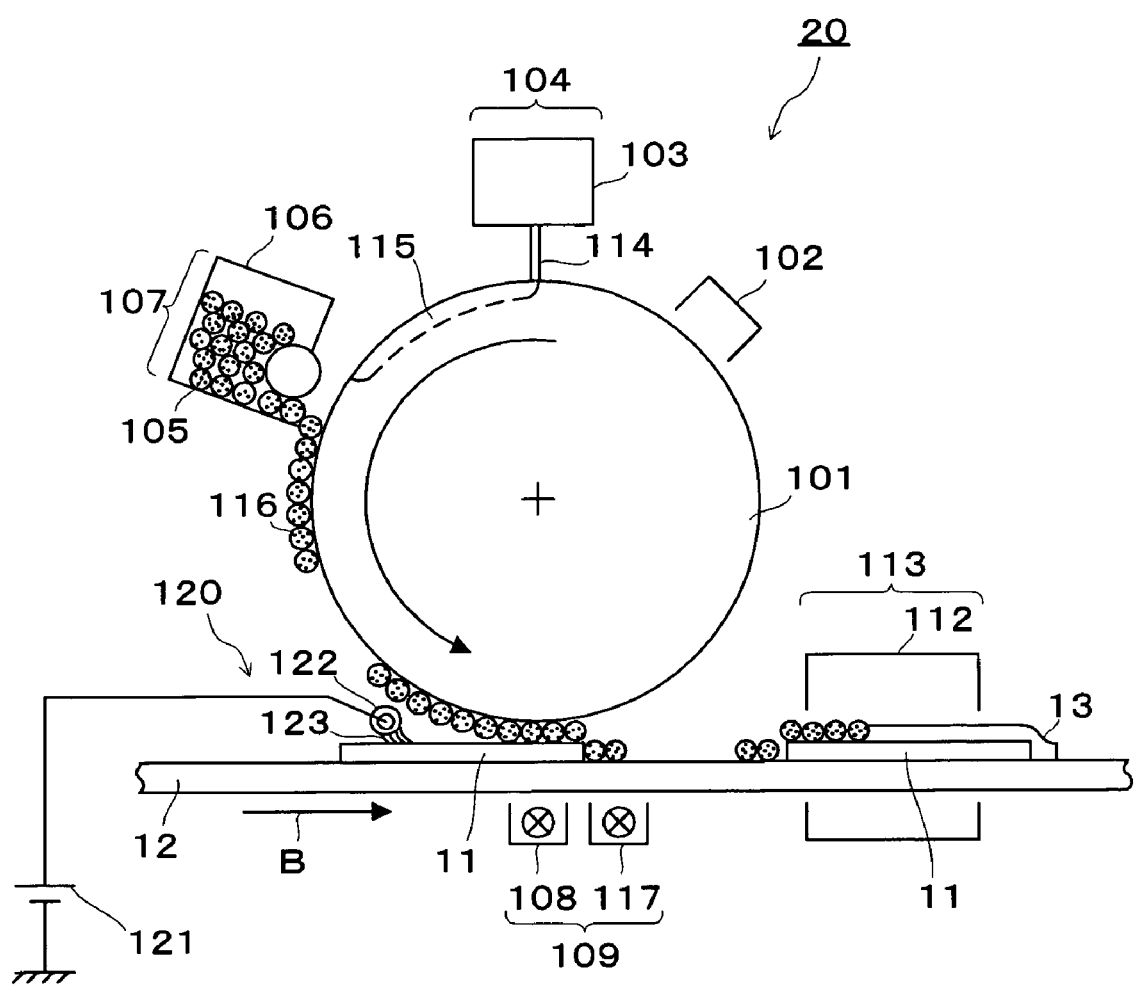
FIG. 7 is a front view showing the schematic structure of an image forming apparatus according to a second embodiment of the present invention.

Next, an image forming apparatus according to a second embodiment of the present invention will be explained with reference to FIG. 7. Similarly to the first embodiment, an image forming apparatus 20 shown in FIG. 7, to which an electrophotographic system is applied, is used as a manufacturing apparatus of an electronic circuit, for example. The manufacturing apparatus of the electronic circuit is used for manufacturing an electronic circuit which has, for example, an insulating layer or a semiconductor layer as a circuitry layer 13 formed on a substrate 12 having a conductor layer 11.

Similarly to the image forming apparatus 10 according to the first embodiment, the image forming apparatus 20 of the second embodiment is constituted of a photoconductive drum 101, an electrifier 102, an exposure unit 104 having a laser generation/scan device 103, a developing unit 107 which has a developing machine 106 accommodating toner 105 made of forming material of the circuitry layer 13, an electrostatic transferring unit 109 having a charge supplying mechanism 108, and a fixing unit 113 having a fixing device 112. It should be noted that the respective components 101, 102, 104, 107, 109 and 113 are the same as those of the image forming apparatus 10 according to the first embodiment, and concrete structures thereof are the same as above.

The image forming apparatus 20 has a bias voltage applying unit 120 adding charges (positive charges, for example) whose polarity is reverse to that of the toner 105 to the surface of the conductor layer 11, instead of the charge removing unit 111 according to the first embodiment. The bias voltage applying unit 120 has a bias charge supplying mechanism 122 which is connected to a power supply 121, for example, and the bias charge supplying mechanism 122 is provided with a contact portion 123 made of conductive material. The conductive contact portion 123 is constituted of a brush made of, for example, the conductive material so that it can obtain an excellent contact state with the surface of the conductor layer 11 which moves in the direction of an arrow B in the drawing. Instead of the conductive brush, the conductive contact portion 123 may be constituted of a conductive roller, band-shaped or plate-shaped conductive rubber, and so on. It is preferable that the conductive contact portion 123 has the shape to be in contact with the entire surface or a part of the surface of the conductor layer 11.

When the transfer of a toner image 116 is started in the electrostatic transferring unit 109, excessive charges are generated in the conductor layer 11 as described above, and a potential difference is caused based on the excessive charges. This potential difference in the conductor layer 11 causes transfer failure of the toner image 116. Hence, the bias voltage applying unit 120 which supplies charges, whose polarity is reverse to the negative charges of the toner 105 and is the same as the positive charges supplied from the electrostatic transferring unit 109, from the front face side of the conductor layer 11 is provided, so as to actively reduce the potential difference caused in the conductor layer 11 accompanying the start of the transfer of the toner image 116. The bias voltage applying unit 120 has the bias charge supplying mechanism 122 which is arranged to be in electrical contact with an exposed face (face where the toner image 116 is not yet transferred) of the conductor layer 11 positioned on the rear side in the moving direction of the substrate 12, to which the addition of the positive charges is started in the electrostatic transferring unit 109.

Supposing that a voltage applied to the electrostatic transferring unit 109 is, for example, 800 to 2000 V, and a potential of the photoconductive drum 101 is 0 V, it is preferable to apply a voltage of approximately 600 to 1200 V (the voltage lower than the electrostatic transferring unit 109) to the bias charge supplying mechanism 122. When the voltage applied to the bias charge supplying mechanism 122 is too low, there is the possibility that the effect for reducing the potential difference in the conductor layer 11 becomes insufficient. Meanwhile, when the voltage applied to the bias charge supplying mechanism 122 is too high, there is the possibility that the toner 105 is drawn to the substrate 12 before reaching the electrostatic transferring unit 109.

Since the positive charges whose polarity is reverse to that of the toner 105 are thus actively supplied to the front face side of the conductor layer 11, it is possible to facilitate the transfer of the toner image 116 such as the insulating resin particle image onto the conductor layer 11. Therefore, it is possible to cover the entire surface of the conductor layer 11 (especially on the rear end side relative to the moving direction of the substrate 12) by the sound circuitry layer 13 such as the insulating layer. Namely, the circuitry layer 13 such as the insulating layer can be formed to have the desired pattern on the metal conductor layer 11 favorably and securely. This contributes significantly to the improvement of a manufacturing yield and manufacturing efficiency of the electronic circuit by the electrophotographic system (wiring board in this embodiment). Incidentally, the concrete formation process of the circuitry layer 13 such as the insulating layer is the same as that of the first embodiment.

Figure 8:
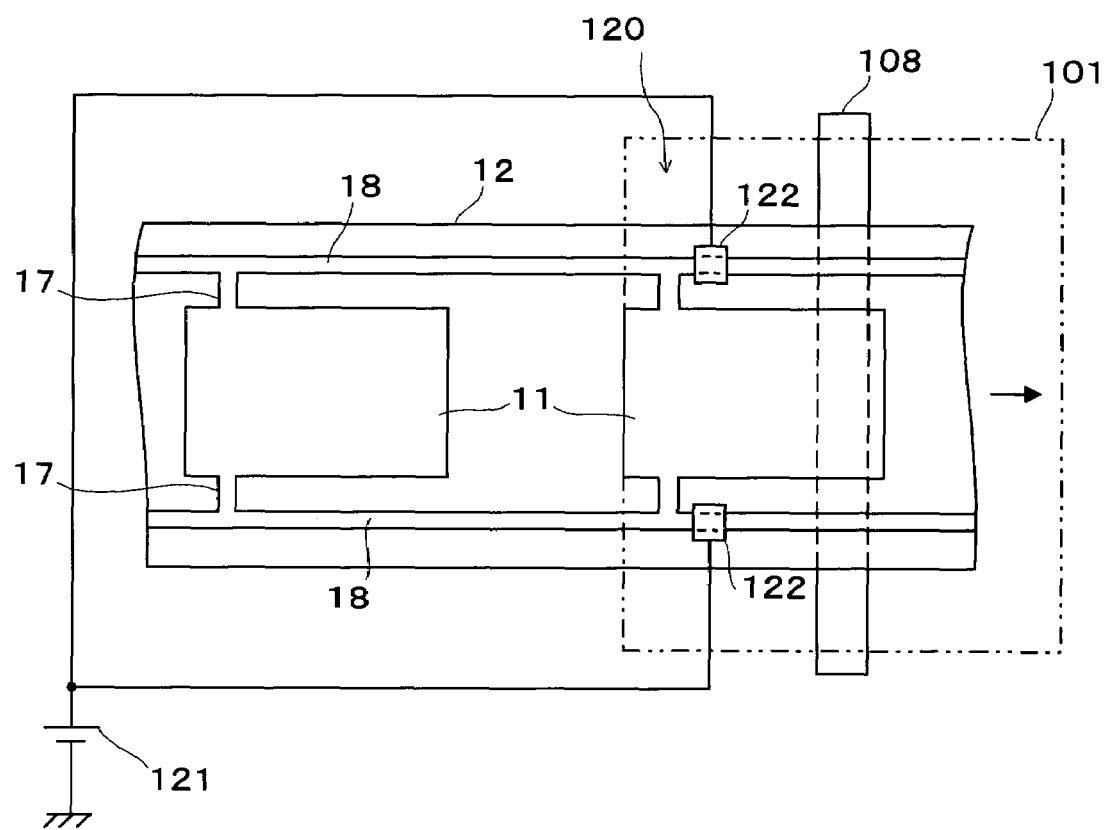
FIG. 8 is a plan view showing the essential structure of a modification example of the image forming apparatus shown in FIG. 7.

In the image forming apparatus 20 of the above-described embodiment, the case where the bias charge supplying mechanism 122 is made in contact with the surface of the conductor layer 11 directly is explained. However, the structure of the bias charge supplying mechanism 122 is not limited to the above. For example, as shown in FIG. 8, dummy patterns 18 which are connected to the conductor layer 11 via leading wires 17 are formed on the substrate 12 in advance, and the bias charge supplying mechanism 122 may be connected to these dummy patterns 18. The substrate 12 shown in FIG. 8 has the dummy patterns 18 which are respectively formed on both sides of the conductor layer 11 continuously along the moving direction of the substrate 12, respectively, and the conductive contact portions 123 of the bias charge supplying mechanism 122 are in contact with these dummy patterns 18, respectively.

Even when the bias charge supplying mechanism 122 is thus connected to the conductor layer 11 via the dummy patterns 18, it is possible to reduce the potential difference in the conductor layer 11 accompanying the start of the transfer of the toner image 116. By reducing the potential difference in the conductor layer 11 by such structure, it is also possible to favorably and securely form the circuitry layer 13 such as the insulating layer to have the desired pattern on the conductor layer 11. Further, the use of the dummy patterns 18 eliminates the need to contact the conductive contact portion 123 of the bias charge supplying mechanism 122 with the conductor layer 11 directly, so that the occurrence of failure due to loss, peeling and the like of the conductor layer 11 can be prevented.

Next, an image forming apparatus according to a third embodiment of the present invention will be explained with reference to FIG. 9. Similarly to the first embodiment, an image forming apparatus 30 shown in FIG. 9, to which an electrophotographic system is applied, is used as a manufacturing apparatus of an electronic circuit, for example. The manufacturing apparatus of the electronic circuit is used for manufacturing an electronic circuit which has, for example, an insulating layer or a semiconductor layer as a circuitry layer 13 formed on a substrate 12 having a conductor layer 11.

Figure 9:
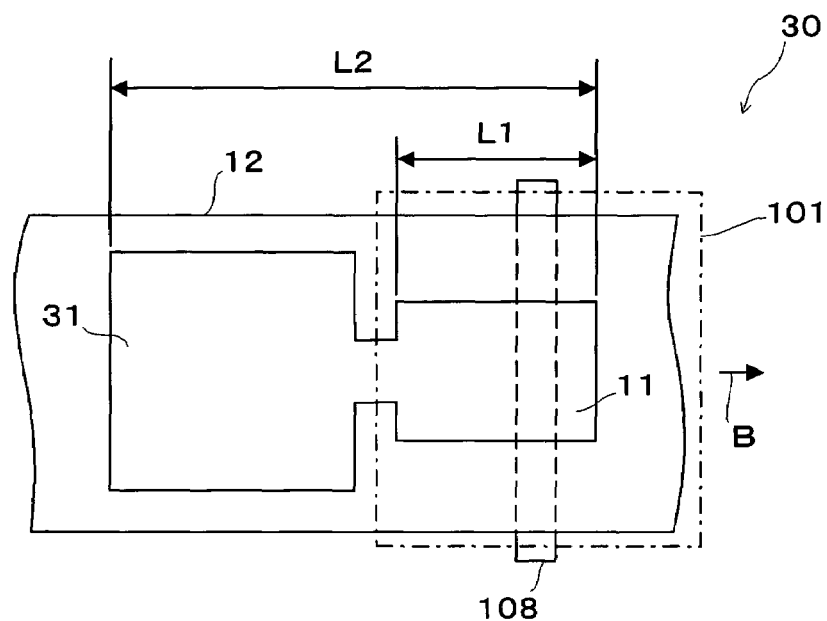
FIG. 9 is a plan view schematically showing only the essential structure of an image forming apparatus according to a third embodiment of the present invention.

It should be noted that FIG. 9 shows only the essential structure of the image forming apparatus 30 according to the third embodiment, and its main part is the same as that of the image forming apparatus 10 according to the first embodiment. That is, the image forming apparatus 30 is constituted of a photoconductive drum 101, an electrifier, an exposure unit having a laser generation/scan device, a developing unit which has a developing machine accommodating toner (toner) made of forming material of the circuitry layer, an electrostatic transferring unit having a charge supplying mechanism 108, and a fixing unit having a fixing device, similarly to the image forming apparatus 10 according to the first embodiment. The respective components are the same as those of the image forming apparatus 10 according to the first embodiment, and concrete structures thereof are the same as above.

In the image forming apparatus 30 according to the third embodiment, the substrate 12 which has a conductive buffer layer 31 connected to the rear side in the moving direction of the conductor layer 11 (the rear side in the moving direction of the substrate 12 shown by an arrow B) is used. That is, the conductive buffer layer 31 which is connected to the rear side in the moving direction of the conductor layer 11 is formed on the surface of the substrate 12 in advance, so that the conductive buffer layer 31 absorbs excessive charges generated in the conductor layer 11 accompanying the start of transfer of a toner image. The function of the conductive buffer layer 31 is similar to that of the grounding to the conductor layer 11 according to the first embodiment.

Formation process of the insulating layer 13 using the image forming apparatus 30 is performed as follows. First, similarly to the first embodiment, the photoconductive drum 101 is made to pass through the electrifier and the exposure unit in order, whereby an electrostatic latent image is formed on its surface corresponding to a formation pattern of the insulating layer 13. Next, the developing machine supplies insulating resin particles as the toner 105 and brings the toner 105 into adhesion with the electrostatic latent image to form the toner image (insulating resin particle image) Subsequently, the toner image is electrostatically transferred onto the substrate 12 in the electrostatic transferring unit.

Figure 10:
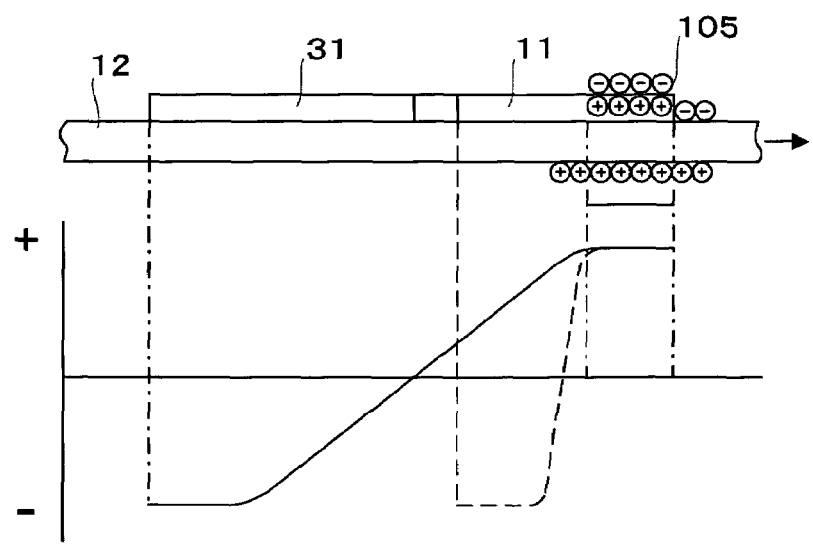
FIG. 10 is a view for explaining the state of potential in a conductor layer and a conductor buffer layer when forming an insulating layer by using the image forming apparatus shown in FIG. 9.

When the electrostatic transfer of the toner 105 onto the substrate 12 is started as shown in FIG. 10, the excessive charges are generated in the conductor layer 11. As to such excessive charges, the buffer layer 31 is connected to the rear side in the moving direction of the conductor layer 11, and hence it is possible to reduce a potential difference due to the excessive charges in the conductive buffer layer 31. Namely, the potential difference caused in the conductor layer 11 by the generated excessive charges has an inclination based on the total length and the like of the conductor layer 11 and the conductive buffer layer 31, whereby the potential difference can be reduced. Thus, it is possible to prevent the occurrence of the phenomenon that the toner 105 on the photoconductive drum 101 is rejected due to the potential difference in the conductor layer 11.

Incidentally, the length of the conductive buffer layer 31 (the length relative to the moving direction of the substrate 12) is set so that it can absorb the excessive charges in the conductor layer 11 and reduce the potential difference. While the length of the conductive buffer layer 31 which can obtain such an effect varies with the area, thickness and the like of the conductor layer 11 and the conductive buffer layer 31, it is preferable to set the length of the conductive buffer layer 31 so that the total length $L_2$ of the conductor layer 11 and the conductive buffer layer 31 is approximately two or more times as long as the length $L_1$ of the conductor layer 11 ($2L_1 \leq L_2$). When the length of the conductive buffer layer 31 is too short, there is the possibility that the inclination of the potential difference due to the excessive charges is not reduced sufficiently.

As described above, since the potential difference in the conductor layer 11 can be reduced by connecting the conductive buffer layer 31 to the rear side in the moving direction of the conductor layer 11 in advance, it is possible to transfer the toner 105 such as the insulating resin particles to the entire surface of the conductor layer 11 (especially on the rear end side relative to the moving direction of the substrate 12) favorably and securely. Namely, the circuitry layer 13 such as the insulating layer can be formed to have the desired pattern on the conductor layer 11 favorably and securely. This contributes significantly to the improvement of a manufacturing yield and manufacturing efficiency of the electronic circuit by the electrophotographic system (electronic circuit constituting the essential part such as the wiring board, semiconductor element and the like).

In the above-described embodiments, the case where the insulating layer is formed as the circuitry layer 13 is mainly explained. However, the circuitry layer 13 is not limited to the insulating layer. For example, when the electrophotographic system is applied to the formation of a semiconductor layer, transfer failure may be caused similarly to the insulating layer, depending on the magnitude of an electric field to be applied. The above-described image forming apparatus according to each embodiment is effective for the formation of such a semiconductor layer. When the semiconductor layer is formed using the image forming apparatus, an organic semiconductor, as well as an inorganic semiconductor such as Si, may be used.

Figure 11:
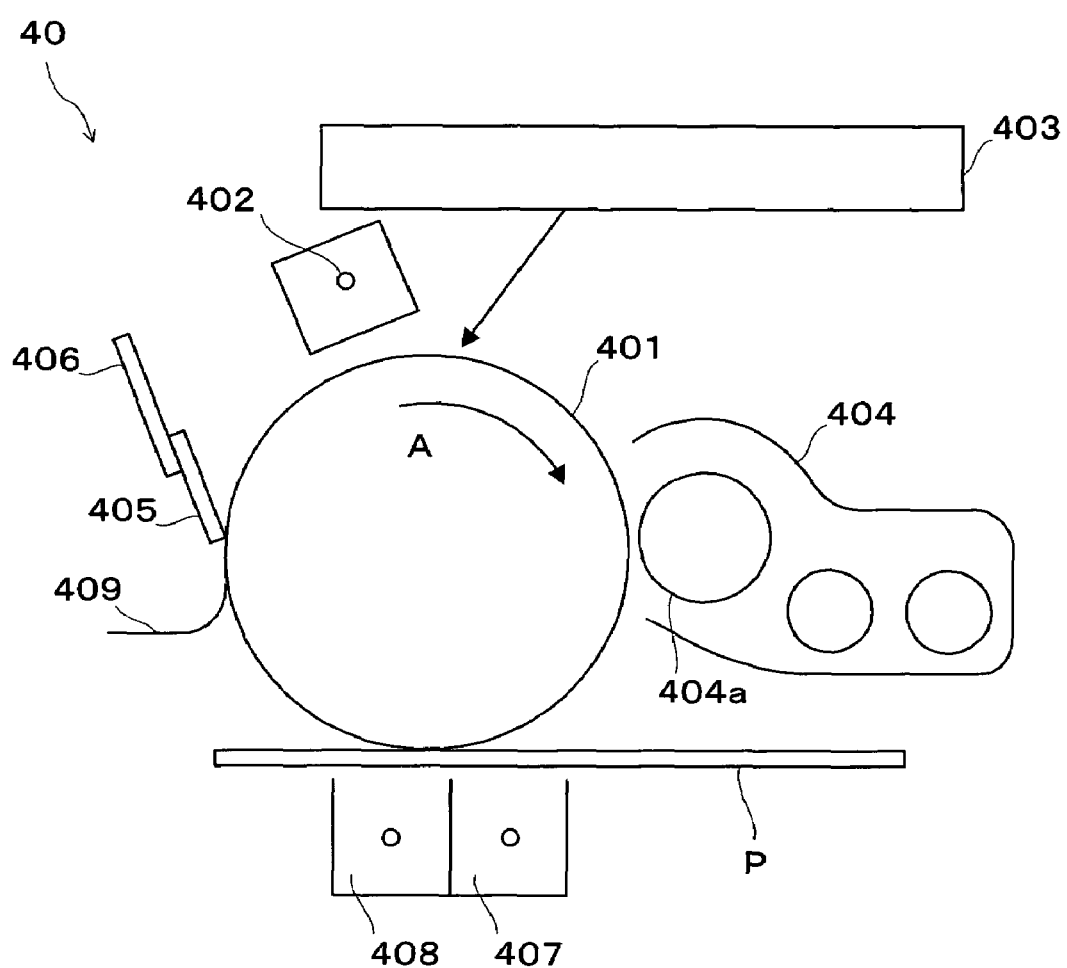
FIG. 11 is a plan view showing the schematic structure of an image forming apparatus according to a fourth embodiment of the present invention.

Next, an image forming apparatus according to a fourth embodiment of the present invention will be explained with reference to FIG. 11. FIG. 11 is a front view showing the schematic structure of an image forming apparatus 40 according to the fourth embodiment of the present invention. Similarly to the above-described embodiments, the image forming apparatus 40 shown in FIG. 11, to which an electrophotographic system is applied, is used as a manufacturing apparatus of an electronic circuit, for example. The manufacturing apparatus of the electronic circuit is used for forming a plating base layer of a conductor layer of a wiring board, and the like.

The image forming apparatus 40 shown in FIG. 11 is mainly constituted of a photoconductor 401, a charging device 402, an aligner 403, a developing device 404, a cleaning blade 405, a sheet metal 406, a transferring device 407, a charge removing device 408, and a recovery sheet 409. The aligner 403 exposes the photoconductor 401 based on pattern information (image information) created by CAD, for example. The cleaning blade 405 is made of urethane rubber, for example, and is supported by the sheet metal 406. The sheet metal 406 is abutted against the photoconductor 401 with a specified load by a not-shown spring. The recovery sheet 409 receives toner dropping down when the cleaning blade 405 scrapes the residual toner on the surface of the photoconductor 401.

Figure 12:
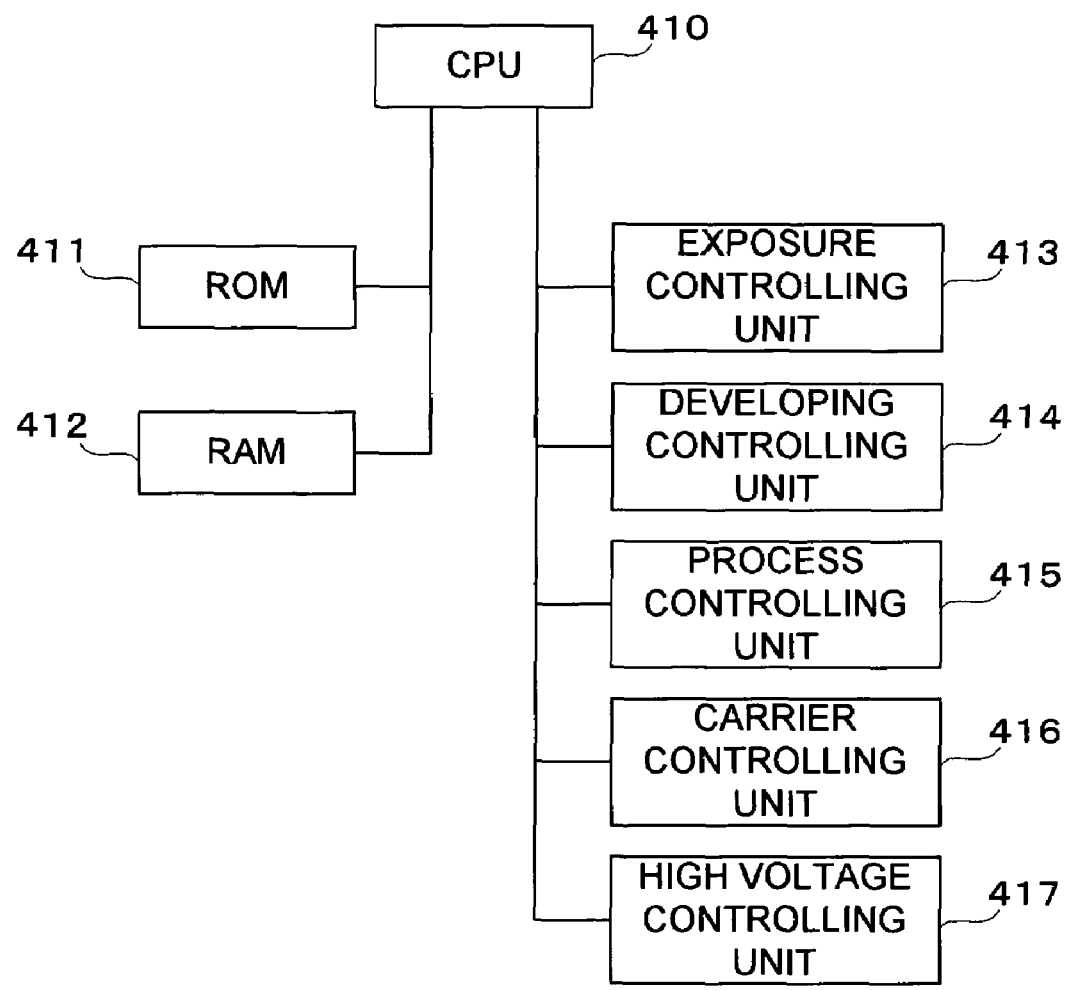
FIG. 12 is a block diagram showing the structure of a control system of the image forming apparatus shown in FIG. 11.

FIG. 12 shows the structure of a control system of the image forming apparatus 40. The control system of the image forming apparatus 40 is mainly constituted of a CPU 410 for governing entire control, a ROM 411 for storing programs and the like, a RAM 412 for temporarily storing data, an exposure controlling unit 413 for controlling the aligner 403, a developing and cleaning controlling unit 414 for controlling the developing device 404, a process controlling unit 415 for controlling each process of charging, exposing, developing and transferring, a carrier controlling unit 416 for controlling a not-shown carrier, and a high voltage controlling unit 417 for controlling the state of application of high voltages such as a grid voltage of the charging device 402, a developing bias of the developing device 404 and the like.

Figure 13:
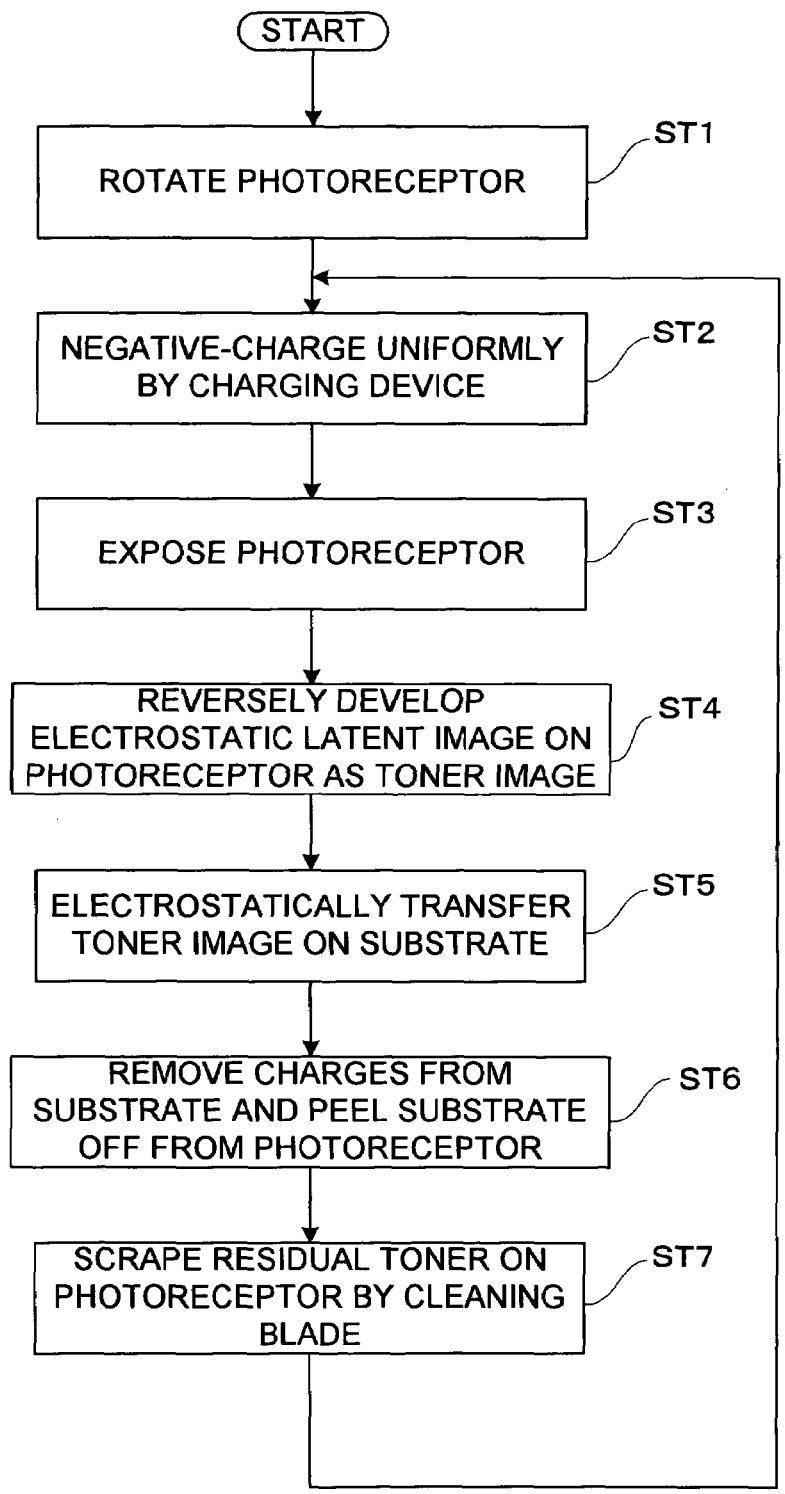
FIG. 13 is a flow chart showing an example of formation process of an image using the image forming apparatus shown in FIG. 11.

Next, the operation of forming the image of the pattern information on a substrate P by using the image forming apparatus 40 according to the fourth embodiment will be explained with reference to a flowchart shown in FIG. 13. The following operation is controlled by the CPU 410. First, the photoconductor 401 is rotated in the direction of a narrow A in the drawing (ST1). Then, the photoconductor 401 is charged negative by the charging device 402 uniformly (ST2). Subsequently, the photoconductor 401 is exposed by the aligner 403 (ST3), and an electrostatic latent image based on the pattern information is formed on its surface. By the developing device 404, the electrostatic latent image on the photoconductor 1 is reversely developed by negative-charged toner to be a toner image (ST4).

The toner forming the toner image is made of binder containing metal particles. Thermoplastic resin is generally used as normal toner for electrophotography. However, according to the toner for forming the electronic circuit, the circuit pattern is required to be stable in heating in the subsequent step, and therefore thermosetting resin is used as the binder. The thermosetting resin for the binder includes phenol resin, melamine resin, furan resin, epoxy resin, unsaturated polyester resin, diallyl phthalate resin, polyimide resin and the like. A glass epoxy substrate and a phenol resin substrate (Bakelite (Trademark), for example) are generally used as the material of the substrate P. It is preferable to use resin having high affinity to these substrates such as epoxy resin, phenol resin, or the mixture thereof as the material of the toner. However, it is possible to use the thermoplastic resin in the case of forming a conductor layer of one layer only.

The toner is formed by mixing and dispersing conductive fine metal powder whose particle size is equal to or smaller than 1 μm in the above binder in the range of 15 to 75 mass %. Transition metal such as Cu, Ni, Co, Ag, Pd, Rh, Au, Pt, Ir and the like is used as the conductive fine metal powder. Some of the metal fine particles dispersed in the binder are exposed partially on the surface of the toner. The circuit pattern is formed on the substrate P by the toner, cured by heating, and thereafter subjected to electroless plating, whereby a metal plating layer which uniformly covers the entire toner pattern can be obtained using the exposed metal fine particles as nuclei. The conductor layer is constituted of the toner layer (plating base layer) and the metal plating layer.

The content of the fine metal powder in the toner is preferably within the range of 15 to 75 mass %. When the content ratio of the fine metal powder becomes too large, electrical resistance of the toner decreases to reduce the quantity of the charges, whereby fog tends to be caused. Meanwhile, when the content ratio of the fine metal powder becomes too small, it is impossible to give enough conductivity to the wiring pattern even after the electroless plating processing. Additionally, it is preferable that the particle size of the fine metal powder is equal to or smaller than 1 μm. When the particle size of the fine metal powder is too large, the dispersion in the binder becomes insufficient, the amount of the exposure of the fine metal powder on the surface of the toner and the amount of the metal fine particles which are free from the binder increase, and as a result, the fog is easily caused. More preferably, the particle size of the fine metal powder is equal to or smaller than 0.7 μm.

Besides the binder and the fine metal powder, the toner may contain wax, disperse auxiliary agent, coloring agent, charge controlling agent and the like as necessary. These raw materials are mixed uniformly and kneaded with heating using a kneading machine such as a pressure kneader, Banbury mixer, two rolls, three rolls, twin-screw extruder, and the like. At this time, the temperature and time in kneading are controlled in order to prevent the binder from curing. The sufficiently kneaded toner is cooled and thereafter ground coarsely. Then, it is finely ground using a jet grinder and the like, and particle size distribution is adjusted using an air classifier and the like. After it is ground and classified, an external addictive such as silica, titanium oxide and the like may be added further to the surface of the toner as necessary. Preferably, the particle size of the toner is equal to or smaller than 12 μm in the 50% particle size on the volume basis, and more preferably, it is equal to or smaller than 10 μm.

It should be noted that Multisizer II manufactured by Beckman Coulter, Inc. is used for measuring the particle size distribution of the toner. AG-4311LCR meter manufactured by Ando Electric Co., Ltd. is used for measuring volume resistivity of the toner. A resistive component of the toner is measured by using a pellet which is molded by the toner with the pressure of 30 ton and has the thickness of about 1.5 mm as a specimen, and by adding the alternating current of 1 kHz, 5 V under the condition of 30° C. The height of the toner on the photoconductor is measured by a laser displacement microscope.

Hereinafter, a concrete example of forming the toner used in this embodiment will be explained. The epoxy resin (50 mass %) as the binder and copper particles whose particle size is 0.7 μm (50 mass %) as the metal fine particles are uniformly mixed by a Henschel mixer for five minutes, and thereafter kneaded by the pressure kneader under the temperature condition of 90° C. for ten minutes. After gelation, it is quenched and ground coarsely by a hammer mill to be equal to or smaller than 2 mm. Subsequently, it is finely ground and classified to be the size of 8 μm using a I-type jet grinder and DSX classifier. The particle size is thus adjusted. The obtained toner and silica R974 (1 mass %) are mixed by the Henschel mixer for ten minutes and thereafter made to pass through a 200-mesh screen, to thereby obtain the toner for forming the wiring pattern (toner for plating base layer). Volume specific resistivity of the toner is $2.9 \times 10^{10}$ Ωcm.

Similarly, the epoxy resin is kneaded by the pressure kneader under the temperature condition of 90° C. for ten minutes. After gelation, it is quenched and ground coarsely by the hammer mill to be equal to or smaller than 2 mm. Subsequently, it is finely ground and classified to be the size of 10 μm using the I-type jet grinder and DSX classifier. The obtained toner and silica R974 (1 mass %) are mixed by the Henschel mixer for ten minutes and thereafter made to pass through the 200-mesh screen, to thereby obtain the toner for forming the insulating pattern.

Figure 14:
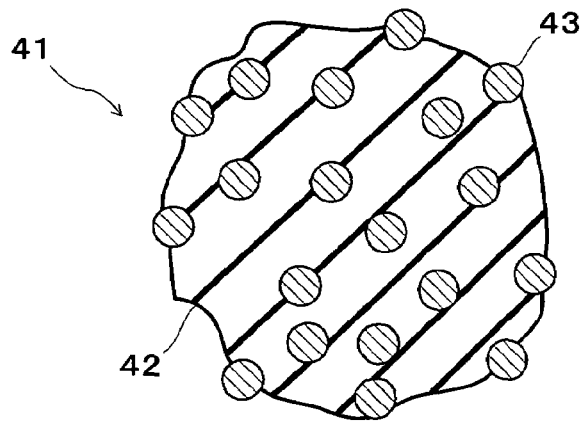
FIG. 14 is a sectional view showing a structural example of toner used in the image forming apparatus shown in FIG. 11.

FIG. 14 shows the structure of metal particle-containing toner 41. This toner particle 41 has copper particles 43 dispersed in binder resin 42. Some of the copper particles 43 are exposed from the surface of the binder resin 42. This exposure of the copper particles 43 is important in copper plating. Therefore, it is necessary that the copper particles 43 are exposed on the surface of the toner particle 41 to some extent. In this embodiment, a two-component developer in which a ferrite carrier coated with silicone-based resin whose average particle size is 60 μm and the above-described toner are mixed at a predetermined mixing ratio is formed to be used. It is of course possible to apply a one-component developing system.

The developed toner image on the photoconductor 401 is rotated to a transfer position to a substrate P. The toner image is electrostatically transferred to the substrate P by positive charges added to the back face of the substrate P in the transferring device 407 (ST5). At this time, the substrate P is carried by the not-shown carrier at the speed almost the same as a circumferential speed of the photoconductor 401. Thereafter, the substrate P is removed with the charges by the charge removing device 408, helped to peel off from the photoconductor 401 to peel off from the photoconductor 401 (ST6). The toner remaining on the photoconductor 401 as transfer remaining toner, out of the toner image transferred from the photoconductor 401 to the substrate P, is scraped by the cleaning blade 405 (ST7). After the residual toner is scraped, the photoconductor 401 is charged again (ST2) and the toner image can be formed on the photoconductor 401 without interruption.

Incidentally, this embodiment shows the case where the toner image is transferred from the photoconductor 401 to the substrate P by the electrostatic transfer. However, the transfer of the toner image is not limited to the above. For example, it is possible to transfer the toner image from the photoconductor 401 to an intermediate transfer body temporarily, and transfer it from the intermediate transfer body to the substrate P. In this case, the transfer remaining toner is similarly generated on the photoconductor 401, and hence it can be applied as a modification example of this embodiment. Besides the electrostatic transfer system, other known transfer systems such as adhesive transfer and pressure transfer can be employed.

Next, "fog" in this embodiment will be explained. The charging device 402 for negative-charging the photoconductor 401 is a scorotron charging device, for example, and the quantity of the charges to be added to the photoconductor 401 can be changed by changing the grid voltage by the high voltage controlling unit 417. Further, the developing bias is applied to a developing roller 404a of the developing device 404 by the high voltage controlling unit 417. In this embodiment, the developing bias of DC−500 V is used. It is also possible to use the developing bias of DC+AC, and in such a case, the value of a DC constituent may be considered as the following developing bias value.

Figure 15:
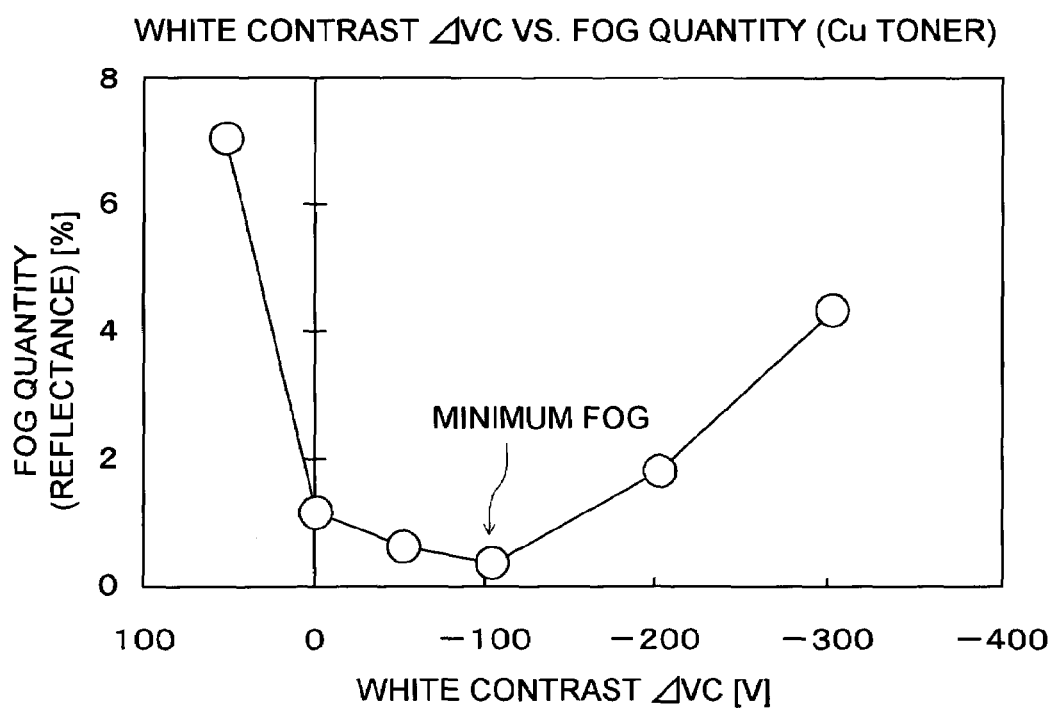
FIG. 15 is a view showing the relationship between white contrast and fog quantity.

FIG. 15 shows the change when a surface potential $V_0$ of the photoconductor 401 is changed from −450 V to −800 V, taking the "fog" as the ordinate, and white contrast as the abscissa. The white contrast is shown by $\Delta V_c = V_0 - V_d$. $V_0$ designates the surface potential of the photoconductor at a developing point, and $V_d$ designates the DC constituent of the developing bias applied to the developing roller 404a. The image is formed as follows. The toner image based on the wiring data (pattern information) having the width of 150 μm and the pitch of 300 μm is transferred onto a glass epoxy substrate (substrate P). After that, it is heated on a hot plate at the temperature of 160° C. for ten minutes, whereby the toner is cured by heating (fixing). In order to measure the "fog", it is also transferred to a plain paper and fixed thereon. A difference of light reflectance of the image transferred to the paper from that of a white paper without being transferred is measured as the "fog".

As a result of this, when the "fog" is equal to or smaller than 2%, it is possible to obtain a satisfactory pattern with less dirt in the periphery of the image and sticking of the toner to a non-image part. Moreover, the glass epoxy substrate which obtains the wiring pattern by the above-described image formation is subjected to electroless copper plating processing using the copper particles exposed from the surface of the cured toner as nuclei. Thus, the conductivity of the wiring layer formed on the glass epoxy substrate is secured. No problem is caused in a continuity test and insulation test of the wiring pattern with secured conductivity which are performed after that.

When the white contrast is +50 V and −300 V, the "fog" exceeds 2%. The glass epoxy substrate to which the wiring pattern is formed based on the image formation with such "fog" is subjected to the electroless copper plating processing to secure the conductivity and then, the continuity test and insulation test of the wiring pattern with the secured conductivity are performed. As a result of this, insulation performance is insufficient. Therefore, the favorable white contrast of the photoconductor 401 is within the range from 0 to −200 V. More preferably, the white contrast is within the range from −50 V to −150 V.

Further, when the similar tests are performed using toner for forming the insulating pattern which is formed without adding the copper particles, the volume specific resistivity of the toner is $7.9 \times 10^{10}$ Ωcm, and the satisfactory pattern with less dirt in the periphery of the image and sticking of the toner to the non-image part can be obtained when the white contrast is within the range from 0 to −300 V. As a result of this, the toner containing the copper particles tends to cause charge injection under a strong electric field because volume resistivity of the toner decreases and some of the copper particles are exposed on the surface of the toner, as compared to the toner without containing the copper particles. After the charge injection, the toner has the positive polarity and adheres to the non-image part of the photoconductor 401 as the "fog".

When the absolute value of the white contrast of the photoconductor 401 is equal to or lower than 200 V, more preferably, equal to or lower than 150 V, the level of the above-described charge injection can be kept within an allowance level. Thus, it is supposed that the "fog" can be reduced to the level without any practical problems. Accordingly, the two-component developing system is superior to the contact one-component developing system with a large development field, in order to obtain the satisfactory wiring pattern with the less "fog".

According to the image forming apparatus 40 of this embodiment described thus far, the plating base layer of the conductor layer constituting the wiring board on the substrate is formed on the substrate by developing the electrostatic latent image by the metal particle-containing toner, transferring the toner image and the like, so that it is possible to form the clear circuit pattern with the less "fog". Whereby, the problems such as a short circuit of the wiring layer and the like can be prevented, and hence the wiring board with high reliability can be manufactured with a high yield.

Figure 16:
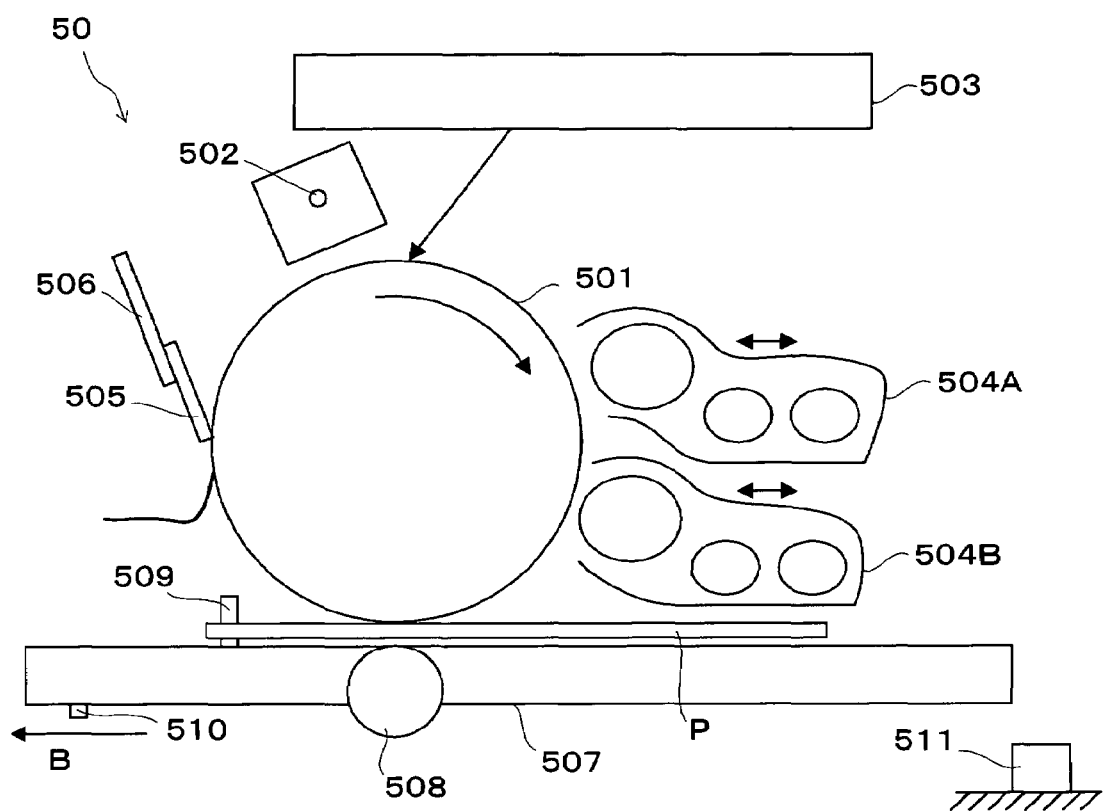
FIG. 16 is a front view showing the schematic structure of an image forming apparatus according to a fifth embodiment of the present invention.
Figure 17:
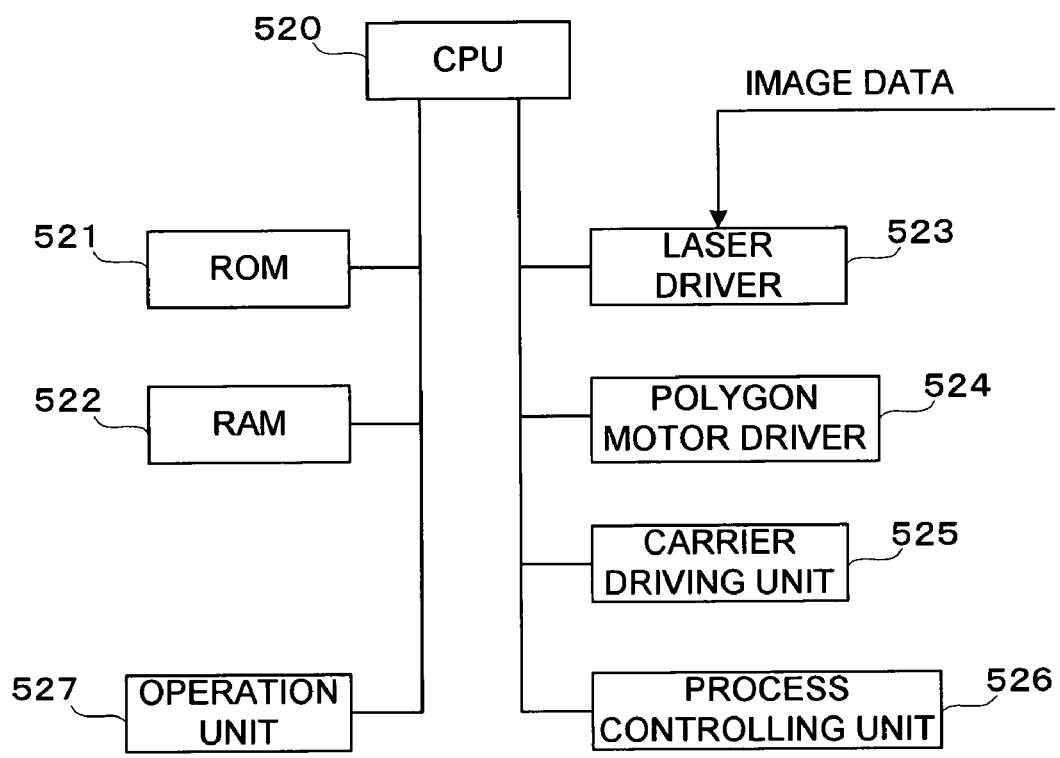
FIG. 17 is a block diagram showing the structure of a control system of the image forming apparatus shown in FIG. 16.

Next, an image forming apparatus according a fifth embodiment of the present invention will be explained with reference to FIG. 16. FIG. 16 is a front view showing the schematic structure of an image forming apparatus 50 according to the fifth embodiment of the present invention. FIG. 17 is a block diagram showing the structure of a control system of the image forming apparatus 50 shown in FIG. 16. Similarly to the fourth embodiment described above, the image forming apparatus 50 of the fifth embodiment shown in these drawings, to which an electrophotographic system is applied, is used as a manufacturing apparatus of an electronic circuit, for example. The manufacturing apparatus of the electronic circuit is used for forming a plating base layer of a conductor layer of a wiring board, an insulating layer covering the conductor layer, and the like. The conductor layer is formed on a substrate for the electronic circuit as a wiring pattern of one layer or multilayer structure.

The image forming apparatus 50 according to the fifth embodiment has a CPU 520 for governing entire control, a ROM 521 for storing a control program, a RAM 522 for storing data, and an operation unit 527 for interfacing with users. The CPU 520 responds to various instructions inputted by the user via the operation unit 527 to control the respective units in the image forming apparatus 50 comprehensively. Further, the image forming apparatus 50 has a laser driver 523 for driving a semiconductor laser oscillator (not shown) of an aligner 503 according to image data supplied from the exterior, a polygon motor driver 524 for driving a polygon motor (not shown) of the aligner 503, a carrier driving unit 525 for driving a transfer material carrier unit 507 to control the carry of a substrate P, a charging device 502, and a process controlling unit 526 for controlling each process of charging, developing and transferring by using developing devices 504A, 504B and a transferring device 508, and so on.

Figure 18:
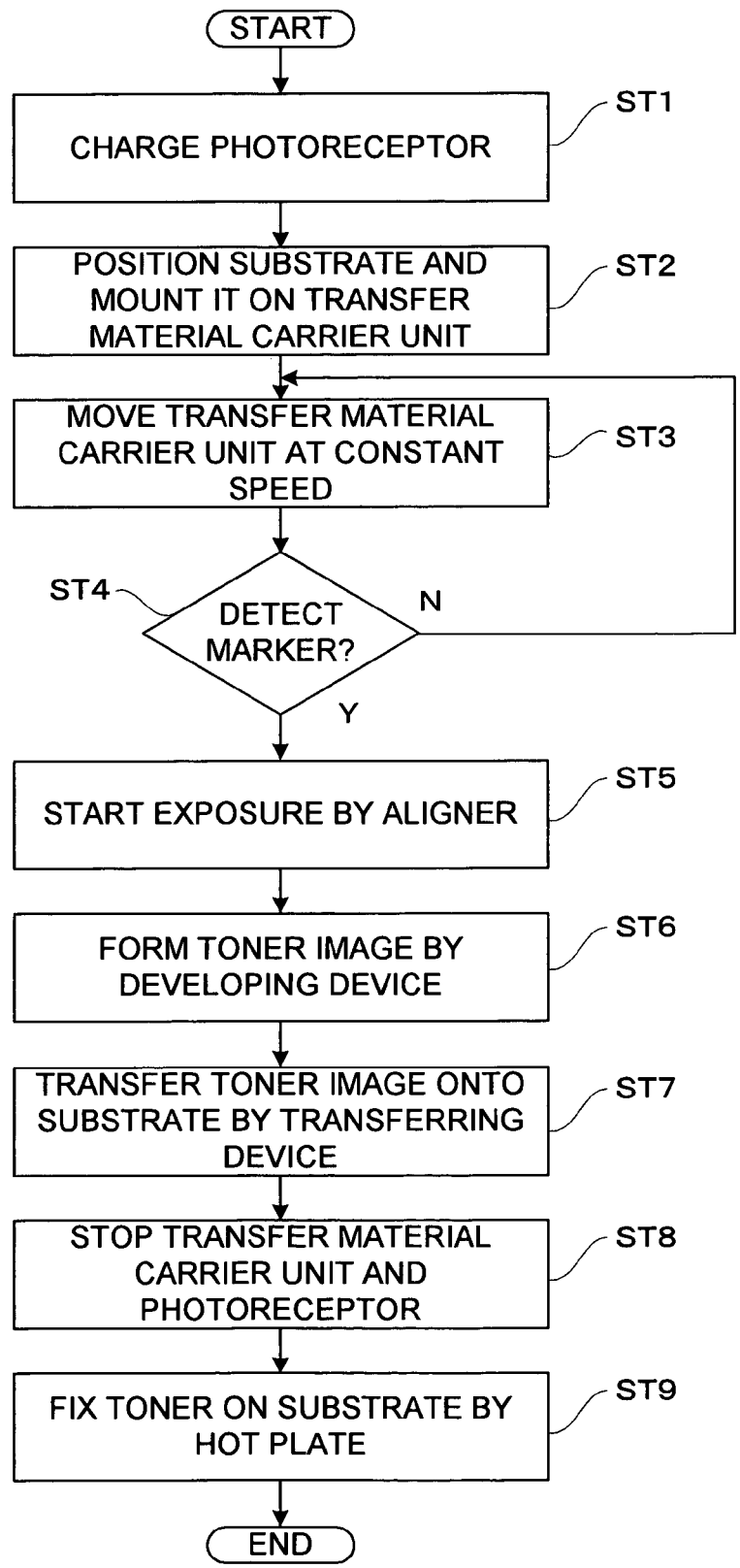
FIG. 18 is a flowchart showing an example of formation process of an image using the image forming apparatus shown in FIG. 16.

FIG. 18 is a flowchart showing an example of basic operation of the image forming apparatus 50. Hereinafter, the operation of the image forming apparatus 50 will be explained with reference to FIG. 18. A photoconductor 501 is rotated in the direction of an arrow A in the drawing, and then charged negative by the charging device 502 uniformly (ST1). The substrate P has holes for positioning. By positioning pins 509 penetrating the holes of the substrate P, the substrate P is mounted on the transfer material carrier unit 507 while being positioned (ST2).

The substrate P has a rectangular shape, and has the holes at its four corners. The transfer material carrier unit 507 has the four positioning pins 509. An interval between the pin 509 in the drawing and the pin positioned in the back thereof (not shown) is set to be wider than the width of the photoconductor 501 in a main-scan direction (longitudinal direction) when developing, in order to prevent the pins from touching the photoconductor 501. Such positioning pins 509 decide the position of the substrate P on the transfer material carrier unit 507.

In a stage before the photoconductor 501 is rotationally driven, the transfer material carrier unit 507 is arranged at its initial position which is the right end of the apparatus. After a predetermined time from the start of the drive of the photoconductor 501 in response to a print start signal from the operation unit 527, the transfer material carrier unit 507 is accelerated in the direction of an arrow B by the carrier driving unit 525 to move at a constant speed (ST3).

The transfer material carrier unit 507 is provided with a reference marker 510. The passage of the reference marker 510 is detected by a reference marker detecting unit 511 provided on the apparatus main body side (YES in ST4). The CPU 520 takes the time when the passage of the reference marker 510 is detected as a reference to start the exposure by the aligner 503 (ST5). The aligner 503 exposes and scans the photoconductor 501 to and with a laser beam based on image data, and forms an electrostatic latent image corresponding to a circuit pattern (wiring pattern and insulating layer pattern) on the surface of the photoconductor 501. The image data is data created by CAD, for example.

The reference marker 510 may be disposed on top of the transfer material carrier unit 507. In this case, the reference marker detecting unit 511 is disposed so as to detect the reference marker 510 disposed on top of the transfer material carrier unit 507. Moreover, the reference marker 510 may be provided on the substrate P disposed on the transfer material carrier unit 507. The reference marker detecting unit 511 is not limited to detect the reference marker provided on the substrate P, but it may detect an image formed on the surface of the substrate P as a reference marker.

Each of the developing devices 504A and 504B reversely develops the electrostatic latent image on the photoconductor 501 by toner charged to a negative potential, to form a toner image (ST6) The developing devices 504A and 504B form the toner images corresponding to the circuit patterns which are different from each other on the photoconductor 501, as will be described later. The toner image on the photoconductor 501 rotates to a transfer position to the substrate P. The toner image is electrostatically transferred by the transferring device 508 onto the substrate P by a positive bias voltage added to the back face of the substrate P (lower side in the drawing) (ST7).

The substrate P which is mounted on the transfer material carrier unit 507 moves at the same speed as a circumferential speed of the photoconductor 501. The toner remaining on the photoconductor 501 as transfer remaining toner, out of the toner image transferred from the photoconductor 501 to the substrate P, is scraped by a cleaning blade 505. The cleaning blade 505 is made of urethane rubber, for example, and is supported by a sheet metal 506. The sheet metal 506 is abutted against the photoconductor 501 with a specified load by a not-shown spring. After the residual toner is scraped, the photoconductor 501 is charged again by the charging device 502 and the toner image can be formed on the photoconductor 501 without interruption.

Although the pin 9 is used for positioning the substrate P on the transfer material carrier unit 507 according to this embodiment, other positioning means such as a grip for mating corners can be used. Further, although the reference marker 510 is equipped to the transfer material carrier unit 507, similar accuracy of position can be obtained even when a mark is printed on the substrate P.

The substrate P, onto which the transfer is completed, moves to the left end of the apparatus together with the transfer material carrier unit 507, decelerates and stops. Further, the photoconductor 501 also stops (ST8). Then, the substrate P is manually removed from the transfer material carrier unit 507. After that, it is heated on a hot plate at the temperature of 160° C. for ten minutes, for example, whereby the toner is cured by heating (fixing) (ST9). Besides the electrostatic transfer, other known transfer methods such as adhesive transfer and pressure transfer may be employed in transferring the toner image. It is possible to transfer the toner image to an intermediate transfer body temporarily, and transfer it from the intermediate transfer body onto the substrate.

The image forming apparatus 50 according to this embodiment has the developing device 504A for developing the electrostatic latent image on the photoconductor 501 by the metal particle-containing toner and the developing device 504B for developing the electrostatic latent image on the photoconductor 501 by the toner for forming the insulating pattern. Abutment and alienation of the developing devices 504A and 504B against and from the photoconductor 501 are possible depending on the pattern to be printed. In the case of forming the wiring pattern (to become the conductor layer by plating), the developing device 504A is abutted against the photoconductor 501. In the case of forming the insulating pattern, the developing device 504B is abutted against the photoconductor 501.

Figure 19:
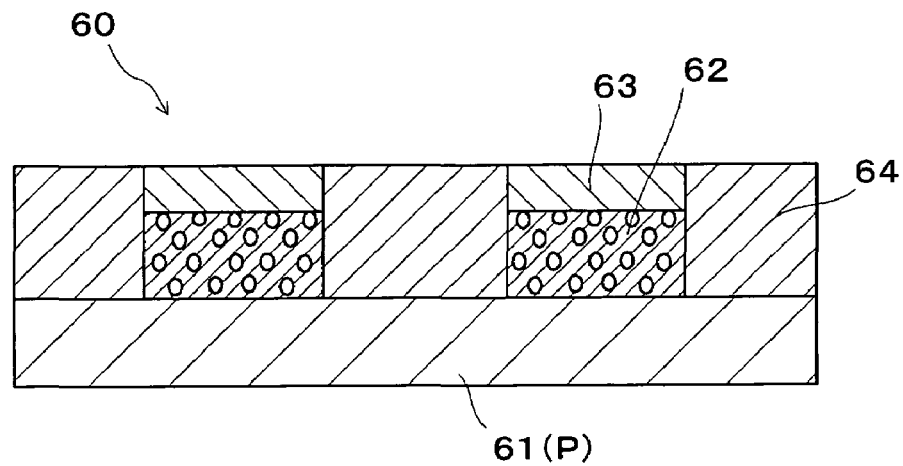
FIG. 19 is a sectional view showing a structural example of a wiring board having a wiring layer of a single layer, which is manufactured using the image forming apparatus shown in FIG. 16.

FIG. 19 is a sectional view showing the essential structure of a wiring board 60 having a wiring layer of a single layer, which is manufactured using the image forming apparatus 50 shown in FIG. 16. The wiring board 60 has a substrate 61 (P), a non-conductive metal-containing resin layer 62 selectively formed on the substrate 61, a conductor metal layer 63 formed on the metal-containing resin layer 62, and a resin layer (insulating layer) 64 selectively formed on the substrate 61. The following is the explanation of an example of formation process of the wiring board 60.

First, a visible image (wiring pattern) of metal-containing resin particles is formed on the photoconductor 501 using the developing device 504A, and the visible image (toner image) is electrostatically transferred onto the substrate P by the transferring device 508. Next, the metal-containing resin particles transferred onto the substrate P are thermally melted and cured thereafter to form the metal-containing resin layer 62 integrated with the metal-containing resin particles. Since the metal-containing resin layer 62 does not have a conductive property, it is subjected to electroless plating processing to form the conductor metal layer 63. The conductor metal layer 63 is formed by making the metal such as Cu precipitate selectively using the metal particles exposing on the surface of the metal-containing resin layer 62 as nuclei. Thus, it is possible to form the wiring pattern having excellent conductivity.

Next, a visible image (insulating pattern) of resin particles is formed on the photoconductor 501 using the developing device 504B, and the visible image (toner image) is electrostatically transferred onto the substrate P by the transferring device 508. Then, the transferred resin particles are thermally melted and cured thereafter to form the resin layer 64 integrated with the resin particles. Thus, it is possible to form the excellent insulating pattern on the substrate P. Here, since the image forming apparatus 50 has the positioning means and the position detecting means of the substrate P, it is possible to enhance accuracy of positioning of the conductor metal layer 63 and the resin layer 64, that is, accuracy of form of the electronic circuit.

Figure 20:
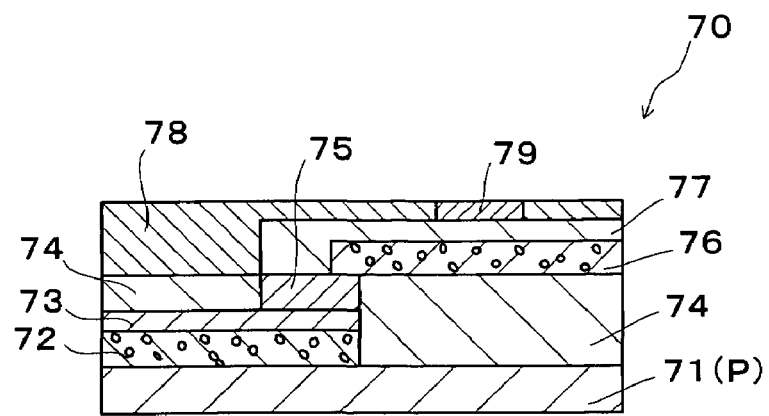
FIG. 20 is a sectional view showing a structural example of a multilayer wiring board having a plurality of wiring layers, which is manufactured using the image forming apparatus shown in FIG. 16.

By performing the above-described formation process of the wiring pattern and the formation process of the insulating pattern by turns, it is possible to manufacture a multilayer wiring board having a plurality of wiring layers. FIG. 20 shows the essential structure of a multilayer wiring board 70 thus manufactured. The multilayer wiring board 70 shown in FIG. 20 has a substrate 71 (P), a non-conductive metal-containing resin layer 72 formed on the substrate 71 selectively, a wiring pattern 73 formed on the metal-containing resin layer 72, an insulating pattern 74 formed on the substrate 71 and the wiring pattern 73 selectively, and a via 75 filled in a recessed portion formed by the wiring pattern 73 and the insulating pattern 74.

Further, the multilayer wiring board 70 has a metal-containing resin layer 76 formed on the insulating pattern 74 and the via 75 selectively, a wiring pattern 77 formed on the metal-containing resin layer 76 and the via 75, an insulating pattern 78 formed on the insulating pattern 74 and the wiring pattern 77 selectively, and a via 79 filled in a recessed portion formed by the wiring pattern 77 and the insulating pattern 78. The wiring patterns 74 and 78 are made of insulating resin. Incidentally, it is possible to layer the respective structure described above further to form a third layer, fourth layer and so on.

This embodiment shows the structure in which the two-tired developing devices 504A and 504B are arranged along the circumferential direction of the photoconductor 501. However, the number and arrangement of the developing devices 504A and 504B are not limited to the above. There is no problem in the structure of mounting only one developing device with respect to the photoconductor, and replacing the developing devices manually or automatically depending on the toner to be printed. A modification example of this embodiment includes an image forming apparatus having the so-called tandem structure in which another photoconductor and developing device are arranged on a downstream side in the moving direction B of the transfer material carrier unit 507.

Figure 21:
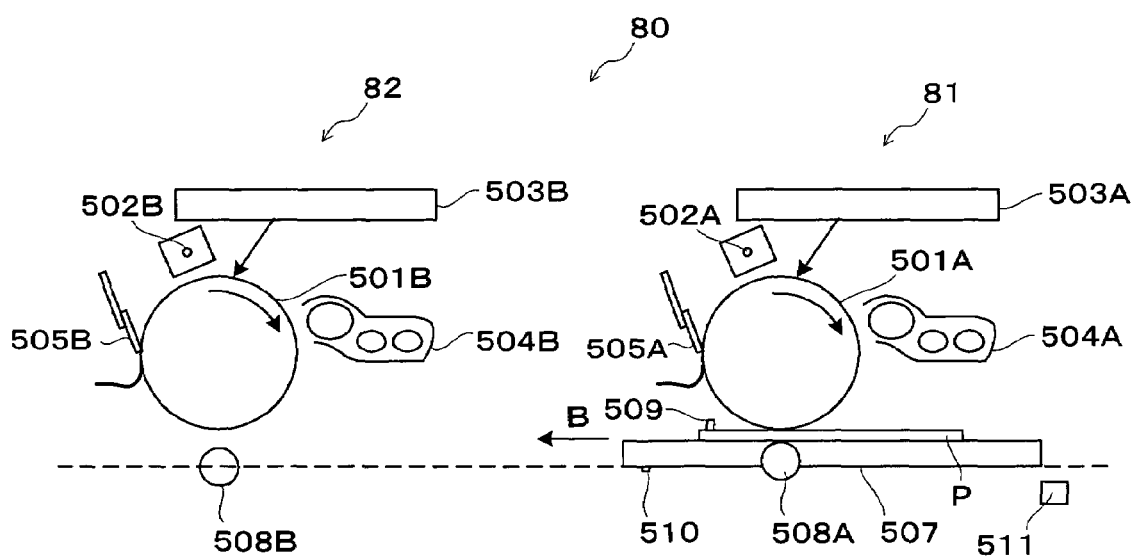
FIG. 21 is a front view showing the schematic structure of an image forming apparatus of tandem structure according to a sixth embodiment of the present invention.

FIG. 21 is a front view showing the structure of an image forming apparatus 80 to which the tandem structure is applied as a sixth embodiment of the present invention. Incidentally, the same numerals and symbols are given to designate the same components as the above-described fifth embodiment, and explanations thereof are partly omitted. The image forming apparatus 80 has a first image forming unit 81 and a second image forming unit 82.

The first image forming unit 81 has a first photoconductor 501A, a first charging device 502A, a first aligner 503A, a first developing device 504A for developing an electrostatic latent image on the first photoconductor 501A by metal particle-containing toner, a first transferring device 508A for transferring a toner image on the first photoconductor 501A onto a substrate P, and further a detecting unit 511. The second image forming unit 82 has a second photoconductor 501B, a second charging device 502B, a second aligner 503B, a second developing device 504B for developing an electrostatic latent image on the second photoconductor 501B by toner for forming an insulating pattern, and a second transferring device 508B for transferring a toner image on the second photoconductor 501B onto the substrate P.

After the metal particle-containing toner is transferred onto the substrate P by the first image forming unit 81, a carrier driving unit 525 carries the substrate P so as to move between the second photoconductor 501B and the second transferring device 508B, under the control of a CPU 520. At this time, an image is not formed in the second image forming unit 82. Metal-containing resin particles transferred onto the substrate P are thermally melted and cured thereafter to form a metal-containing resin layer integrated with the metal-containing resin particles. Since the metal-containing resin layer does not have a conductive property, the metal-containing resin layer is subjected to electroless plating processing of Cu so that Cu is made precipitate selectively by using metal particles exposing on the surface of the metal-containing resin layer as nuclei. Thus, it is possible to obtain the wiring pattern having excellent conductivity.

Next, the substrate P is mounted on a transfer material carrier unit 507 in order to form an insulating pattern. The insulating pattern is transferred in an overlapping manner onto the wiring pattern on the substrate P by the second image forming unit 82. At this time, an image is not formed in the first image forming unit 81. The CPU 520 takes time when the passage of a reference marker 510 is detected by a detecting unit 511 as a reference to allow the second aligner 503B to start the exposure of the second photoconductor 510B. Thereafter, the insulating pattern consisting of the resin particles is formed on the second photoconductor 501B by the second developing device 504B. Subsequently, the toner image of the insulating pattern is electrostatically transferred onto the substrate P by the second transferring device 508B, and is heated as above. Thus, the circuit pattern shown in FIG. 19 is formed.

According to this embodiment described thus far, the substrate P is positioned and mounted on the transfer material carrier unit 507, and the exposure to the photoconductors 501A and 501B is started by taking the time when the passage of the reference marker 510 of the transfer material carrier unit 507 is detected as the reference. Accordingly, the wiring layer and the insulating layer can be formed with high accuracy of position. This also applies to the case where the wiring layers and the insulating layers are formed in multiple layers. When the wiring pattern and the insulating pattern are actually formed using the image forming apparatuses shown in FIG. 16 and FIG. 21, a deviation of the patterns can be kept within 200 μm at a maximum, in both of main-scan direction and sub-scan direction of the aligner 503. Further, by devising the shape of the insulating pattern and the shape of a connecting portion (via) between the wiring layers, it is possible to obtain the wiring board without any practical problems.

It should be noted that the present invention is not limited to the above-described embodiments, and any modification can be made at the stage of execution without departing from a technical scope of the present invention. Further, all possible combinations of the respective embodiments can be made as necessary to obtain combined effects. Moreover, the above-described embodiments include inventions at various stages, and various inventions maybe extracted by properly combining a plurality of components disclosed. Furthermore, the electronic circuit to which the present invention is applied is not particularly limited as long as it has the wiring board of the single layer or multilayer structure, the various electronic devices and electronic components, the conductor layer and insulating layer, and the like.

What is claimed is:

1. An image forming apparatus for forming an image on a substrate having a conductor layer, using toner containing formation material of a circuitry layer, the image forming apparatus comprising:
    a photoconductor;
    an exposure unit exposing said photoconductor based on image information of the circuitry layer to form an electrostatic latent image on said photoconductor;
    a developing unit developing the electrostatic latent image on said photoconductor by the toner to form a toner image on said photoconductor;
    an electrostatic transferring unit transferring the toner image on said photoconductor onto the substrate so that at least a part of the conductor layer is covered with the toner image; and
    a charge removing unit arranged to be in electrical contact with at least a part of an exposed face of the conductor layer and electrically grounded to remove excessive charges caused in the conductor layer accompanying the start of the transfer of the toner image.

2. An image forming apparatus according to claim 1, wherein the substrate has a dummy pattern led out from the conductor layer, and wherein said charge removing unit is in contact with the dummy pattern.

3. An image forming apparatus according to claim 1, wherein the formation material of the circuitry layer comprises insulating resin.

4. An image forming apparatus forming an image on a substrate having a conductor layer, using toner containing formation material of a circuitry layer, comprising:
    a photoconductor;
    an exposure unit exposing said photoconductor based on image information of the circuitry layer to form an electrostatic latent image on said photoconductor;
    a developing unit developing the electrostatic latent image on said photoconductor by the toner to form a toner image on said photoconductor;
    an electrostatic transferring unit transferring the toner image on said photoconductor onto the substrate so that at least a part of the conductor layer is covered with the toner image; and
    a bias voltage applying unit arranged to be in electrical contact with at least a part of an exposed face of the conductor layer to add charges of which polarity is reverse to that of the toner to the conductor layer.

5. An image forming apparatus according to claim 4, wherein the substrate has a dummy pattern led out from the conductor layer, and
    wherein said bias voltage applying unit is in contact with the dummy pattern.

6. An image forming apparatus according to claim 4, wherein the formation material of the circuitry layer comprises insulating resin.

7. An image forming apparatus forming an image on a substrate using toner containing metal particles, comprising:
    a photoconductor;
    a charging unit charging said photoconductor;
    an exposure unit exposing said photoconductor which is charged in said charging unit, based on image information;
    a developing unit developing said photoconductor which is exposed in said exposure unit, using the toner;
    a controlling unit controlling an absolute value of white contrast of said photoconductor to 200 V or lower, when developing said photoconductor in said developing unit; and
    a transferring unit transferring a toner image, which is formed on said photoconductor in said developing unit, onto the substrate.

8. An image forming apparatus according to claim 7, wherein said controlling unit controls the absolute value of the white contrast to 150 V or lower.

9. An image forming apparatus according to claim 7, wherein said controlling unit controls the white contrast shown as $V_0 - V_d$, where a surface potential of said photoconductor when it is developed in said developing unit is $V_0$ and a DC constituent of a developing bias applied to said developing unit is $V_d$.

10. An image forming apparatus forming an image on a substrate, comprising:
    a photoconductor;
    an exposure unit exposing said photoconductor based on image information to form an electrostatic latent image on said photoconductor;
    a developing unit developing the electrostatic latent image on said photoconductor by toner to form a toner image on said photoconductor;
    a transferring unit transferring the toner image on said photoconductor onto the substrate;
    a substrate carrier unit comprising a positioning means to mount the substrate on a predetermined position and a reference marker to show a position of the substrate to be carried, to carry the substrate so that the substrate moves between said photoconductor and said transferring unit;
    a detecting unit detecting a passage of the reference marker; and
    a controlling unit allowing said exposure unit to start exposure of said photoconductor, by taking time when said detecting unit detects the passage of the reference marker as a reference.

11. An image forming apparatus according to claim 10, wherein said developing unit comprises a first developing device developing the electrostatic latent image on said photoconductor by metal particle-containing toner and a second developing device developing the electrostatic latent image on said photoconductor by toner for forming an insulating layer.

12. An image forming apparatus forming an image on a substrate, comprising:
    a first image forming unit comprising a first photoconductor, a first exposure unit exposing the first photoconductor based on image information to form an electrostatic latent image on the first photoconductor, a first developing unit developing the electrostatic latent image on the first photoconductor by metal particle-containing toner to form a toner image on the first photoconductor, and a first transferring unit transferring the toner image on the first photoconductor onto the substrate;
    a second image forming unit comprising a second photoconductor, a second exposure unit exposing the second photoconductor based on image information to form an electrostatic latent image on the second photoconductor, a second developing unit developing the electrostatic latent image on the second photoconductor by toner for forming an insulating layer to form a toner image on the second photoconductor, and a second transferring unit transferring the toner image on the second photoconductor onto the substrate;

a substrate carrier unit comprising a positioning means to mount the substrate on a predetermined position and a reference marker to show a position of the substrate to be carried, to carry the substrate so that the substrate moves between the first photoconductor and the first transferring unit and between the second photoconductor and the second transferring unit;

a detecting unit detecting a passage of the reference marker; and a controlling unit controlling the formation of the image by said first and second image forming units, by taking time when said detecting unit detects the passage of the reference marker as a reference.

* * * * *